United States Patent [19] [11] Patent Number: 4,633,483
Takahashi et al. [45] Date of Patent: Dec. 30, 1986

[54] NEAR-INSTANTANEOUS COMPANDING PCM INVOLVING ACCUMULATION OF LESS SIGNIFICANT BITS REMOVED FROM ORIGINAL DATA

[75] Inventors: Susumu Takahashi; Hiroyuki Kanzaki, both of Tokyo, Japan

[73] Assignee: Sansui Electric Co., Ltd., Tokyo, Japan

[21] Appl. No.: 596,199

[22] Filed: Apr. 2, 1984

[30] Foreign Application Priority Data

| Mar. 31, 1983 | [JP] | Japan | 58-056197 |
| Jul. 7, 1983 | [JP] | Japan | 58-123960 |
| Aug. 16, 1983 | [JP] | Japan | 58-149418 |
| Aug. 25, 1983 | [JP] | Japan | 58-155509 |
| Sep. 5, 1983 | [JP] | Japan | 58-163042 |
| Sep. 27, 1983 | [JP] | Japan | 58-178890 |
| Feb. 6, 1984 | [JP] | Japan | 59-019743 |

[51] Int. Cl.$^4$ .................................... H03M 7/30
[52] U.S. Cl. ................................. 375/25; 375/27; 375/122
[58] Field of Search .................. 375/25, 26, 27, 30, 375/32, 34, 122; 370/118; 332/11 D; 329/104

[56] References Cited

U.S. PATENT DOCUMENTS

| 3,723,909 | 3/1973 | Condon | 332/11 D |
| 3,927,372 | 12/1975 | Zschunke | 329/104 |
| 4,005,274 | 1/1977 | Vagliani et al. | 375/34 |
| 4,205,200 | 5/1980 | Parikh et al. | 370/118 |
| 4,352,191 | 9/1982 | Un | 375/30 |

Primary Examiner—Robert L. Griffin
Assistant Examiner—Raymond C. Glenny
Attorney, Agent, or Firm—Sughrue, Mion, Zinn, Macpeak and Seas

[57] ABSTRACT

A data transmission system combines a near-instantaneous companding system with PCM or DPCM transmission data. In the transmitting side, lower bits are removed from an original data, to form transmission data and are accumulated in an accumulator. When a carry is caused as a result of such accumulation, the carry is added to the transmission data. Thus, total amount of the original data can be transmitted to the receiving side, thereby to improve a transmission quality and to reduce quantizing-noise. When the removed bits are subject to an addition, it is determined whether an overflow occurs. When the overflow occurs, the addition is not performed and such a logic operation as to prevent the overflow is performed.

19 Claims, 33 Drawing Figures

Fig. 6
PRIOR ART
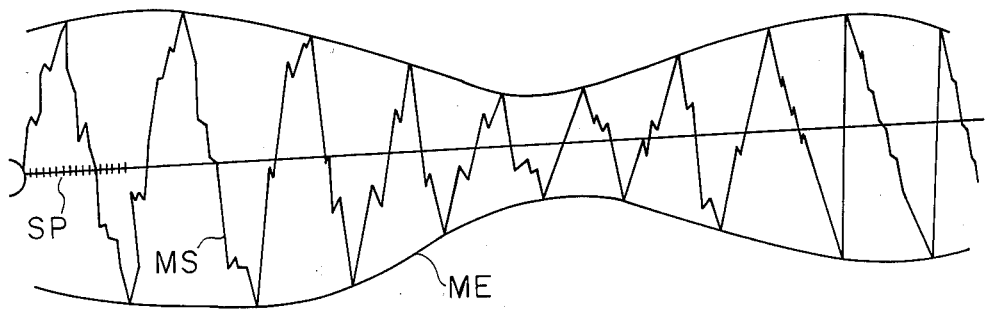
PRIOR ART
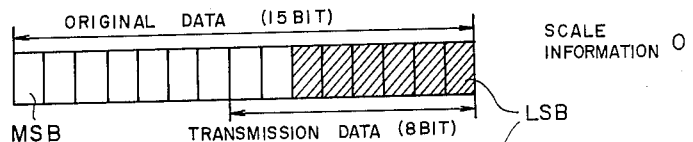
Fig. 7A — SCALE INFORMATION 0
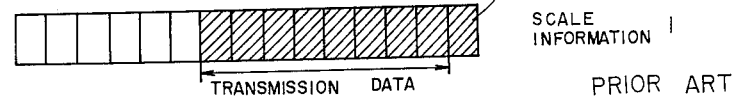
Fig. 7B — SCALE INFORMATION 1
PRIOR ART
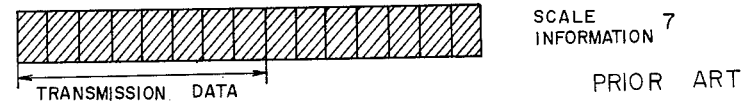
Fig. 7C — SCALE INFORMATION 7
PRIOR ART

Fig. 21

(a) DPCM ORIGINAL DATA (SCALE 5) | 0 | 0 | 0 | 0 | 1 | 0 | 1 | 1 | 1 | 0 | 1 | 0 | 1 | 1 | 0 | 1 |

(b) ACCUMULATION OF REMOVED BITS | 1 | 1 | 1 | 1 | 0 |

(c) RESULT OF ADDITION | 0 | 0 | 0 | 0 | 1 | 0 | 1 | 1 | 1 | 0 | 0 | 1 | 0 | 1 | 1 |

(d) COMPRESSED DATA | 0 | 1 | 0 | 1 | 1 | 1 | 0 |

NEAR-INSTANTANEOUS COMPANDING PCM INVOLVING ACCUMULATION OF LESS SIGNIFICANT BITS REMOVED FROM ORIGINAL DATA

BACKGROUND OF THE INVENTION

The present invention relates to a data transmission system wherein an analog signal is digitized, the digital signal is applied to a transmitting system such as a transmission line, modulating/demodulating system, or recording/reproducing system, and the transmitted signal is received from the transmitting system and reconverted into the analog signal. More particularly, it relates to a signal transmission system which employs differential pulse code modulation (DPCM).

In recent years, owing to the advent of digital audio equipment etc., a transmission system has come into use wherein the analog signal of, e.g., music, is digitized by PCM (pulse code modulation), the digital signal is transmitted, and the transmitted signal is received and reconverted by a receiving system into the original analog signal. This system of digitizing the analog signal for transmission, however, has the problem that quantization noise develops during the PCM conversion of the analog singal. In order to reduce the quantization noise, the number of bits of the digital signal may be increased in the digitization of the PCM conversion. This measure, however, leads to the problem that the transmission efficiency is lowered.

On the other hand, in a case where the analog signal to be transmitted is an audio signal, there has been a system wherein conventional noise reduction circuits for analog signals are disposed before and behind the PCM transmission system because unless the noise is offensive to the ear, it can be, in effect, deemed to have been reduced.

FIG. 1 is a block diagram showing the system. In the drawing, the audio input, such as music applied to the input terminal Ain, is encoder in a noise reduction encodor 1. The encoded signal is digitized by an A/D (analog to digital converter) 2 and is subject to a data compression processing in a signal processing circuit 3 in a transmitting side.

The PCM signal transmitted from the transmission system is subject to a data expansion and data reproduction processing, in a processing circuit 4 in a receiving side. The data is again converted to the analog data in a D/A (Digital to Analog converter) 5 and is decoded in a noise reduction decoder 6 corresponding to the noise reduction encoder 1, thereby producing an audio output from an output terminal Ao. The audio output is produced, through a loudspeaker, as sound.

Quantization noise which develops during the digitization needs to be reduced for lowering the level of noise contained in the audio signal of music or other output to be emitted from a loudspeaker or other equipment. Regarding the reduction of the quantization noise, when the analog signal entering the A/D converter 2 exceeds the maximum value which can be processed by this converter, it is clipped to cause a clipping distortion. Therefore, the analog signal should preferably have a magnitude which is not greater than the maximum value processible by the A/D converter 2 and which is as close as possible to this maximum value. That is, the input signal of the A/D converter 2 should have a substantially constant value sufficiently close to the maximum value processible by the A/D converter 2. However, when the priorart noise reduction system is applied, a problem, which is discussed below, is involved. With the noise reduction system, the input signal should be rendered sufficiently greater than a fixed level of noise arising in the total system, such as a recording medium, and then transmitted (for recording, for example). It is ideal to perform this processing near the dynamic range of the transmitting system. On the side of the noise reduction encoder 1, accordingly, a great input signal is passed without change, and a small input signal has its level raised and is outputted. The latter signal is restored to the original magnitude on the side of the noise reduction decoder 6. In raising the level of the small signal in the encoding operation, however, this small signal must be controlled so as to hold a level lower than that of the great signal. Accordingly, even in the case where the encoded signals are applied to the A/D converter 2, the difference between the maximum and minimum values of the input levels of the A/D converter 2 cannot be made small. For this reason, the number of bits in the digitization cannot be rendered small in the prior-art noise reduction system. If the number of bits is set to be small, the influence of the quantization noise cannot be satisfactorily reduced.

In addition, the decoder side obtains control information in accordance with the magnitude of the level of the encoded signal, namely, the signal entering the decoder. In the case of the audio signal, in order to provide a proper signal level without incurring a ripple in a control signal even at the lower-limit value of the audio frequency, the control information needs to be obtained, as such low frequency is not followed up. To the end of obtaining the satisfactory control information from the input signal of the decoder, the period of time taken for obtaining the control information from the input signal, in other words, the control time constant, needs to be set at a sufficient value. The time constant of the encoder side is accordingly, also set at a large value. However, when the control time constant is increased in this manner, the control on the encoder side can not follow a high frequency signal, such as a signal of abrupt attack in the sound of a piano. In consequence, an excess level signal is applied to the A/D converter to give rise to a clipping distortion.

When the clipping distortion has arisen in the encoder side or the transmitting system due to the aforementioned cause, the relation of the magnitudes of levels can no longer be properly held in the transmission. As a result, not only is the clipped waveform reproduced on the decoder side, but even the unclipped part will have an improper level in many cases. This is attributed to the fact that correct control voltages cannot be obtained on the decoder side on account of the clipping phenomenon, and because of problems of tone quality, including the attack of a piano, take place.

In order to eliminate the drawbacks, a method to be described below has hitherto been utilized as a signal transmission system which can effectively reduce the noise component of the quantization noise that develops in the case of digitizing the analog signal.

Whereas the ordinary PCM encoding samples the original analog signal, such as an audio signal at every moment, and transmits the sampled value as digital data, namely, a PCM code, this method consists of a transmission system based on DPCM codes wherein only the difference between two successive sampled values is used as digital data. FIG. 2 shows an example of such transmission system employing the DPCM encoding.

In the illustrated system, the difference is not taken in terms of analog values but in terms of digital values. More specifically, on the sending side, the original analog signal is converted into digital data of, e. g., 15 bits, by an A/D (analog-to-digital) converter 7. The data enters a delay circuit 8 constructed of a register or the like, and is delayed by one sampling interval therein. The delayed signal enters a differentiator 9 along with the converted digital data of the original analog signal subsequently sampled. When the DPCM code consists of 16 bits, the differential data between both the digital data inputted to the subtracter or difference detector 9 is delivered to a transmitting system as data of 16 bits.

The differential data transmitted by the transmitting system enters a receiving side. On the receiving side, the differential data, which consists of 16 bits in this case, is applied to an adder 10. Here, a delay circuit 11 provides the output of the adder 10 corresponding to the last sampling interval, and the adder 10 adds up the differential data presently received and the last output of the adder 10 provided from the delay circuit 11. The added data which is composed of, e. g., 15 bits, is delivered to a D/A (digital-to-analog) converter 12, from which a reconverted analog signal is provided as an output.

The feature of the DPCM encoding is that, by transmitting the differential data between the respectively two samples adjoining in time, the values of the digital data to be transmitted can be made small on the average; in other words, the average level can be lowered, so that the bit number of the digital data can be reduced.

FIG. 3 is a diagram showing the relationship between the value $D_p$ of the data, in the case of transmitting the original analog signal $S_o$ by the usual PCM, and the value $D_d$ of the data in the case of trahsmitting the same by the DPCM. It is readily understood from the figure that, insofar as the sampling interval $T_s$ is of short (appropriate) signal period relative to the original analog signal, the transmission data has a smaller value on the average in the transmission by the the DPCM than in the transmission by the PCM. Especially in a case where the frequency of the original analog signal is sufficiently low in comparison with the sampling frequency as illustrated in the figure, the differential data $D_d$ becomes a much smaller value. Thus, if the quantization error is the same as in the PCM system, The DPCM system can bring a smaller number of bits into correspondence with the analog signal, and if the numbers of bits are equal, the DPCM system can reduce the quantization error. Therefore, the DPCM transmission becomes more effective.

Accordingly, when a certain music signal is transmitted, by way of example, as to the digital data to be transmitted by the DPCM transmission the appearance probability of smaller values is high and the appearance probability of larger values is conspicuously low, resulting in the rare appearance of large values, as shown in FIG. 4. In contrast, the tendency of the transmission data items to concentrate near zero is low in the PCM transmission. The feature of the DPCM transmission is based on the fact that, since the waveform of the music signal usually has a very gentle slope within a sampling time, and the difference between the two adjacent samples is comparatively slight, the digital levels concentrate near zero. Accordingly, when the PCM codes, each consisting of 16 bits, are transmitted by the DPCM, 8 to 10 bits or so are usually sufficient for properly transmitting most data items, and an appreciable transmission can be executed.

Although the transmission data value decreases on the average, such DPCM transmission has the problem that the maximum-level data appearing on rare occasions becomes substantially the same data value (level) as, or even more than that in the PCM transmission.

Thus, two characterizing features of the DPCM transmission are; (i) that the average level of the transmission data is very low, and, (ii) that although the maximum level of the transmission data is the same as, or more than in the usual PCM transmission, the probability of the appearance thereof is very low.

As a system for effectively transmitting the data items as above described, which has the low average level and which exhibits the low probability of the appearance of signals having great level differences, also to be considered is a system in which the ordinary transmission is executed with a predetermined number of bits smaller than that of the original data, whereas as to the signal having the great level difference in excess of the expressible range of the predetermined number of bits, only upper significant valid bits are transmitted with the predetermined number of bits, the remaining less significant bits being disregarded. In this case, as to the disregarded less significant bits, the contents of the disregarded bits are not sent, but only the number of the disregarded bits or the number of bits corresponding to the shift quantity is binary-coded and then transmitted to the receiving side. The aforementioned more significant valid bits are restored to the correct bit positions on the receiving side, whereby the original analog signal can be reproduced almost exactly. This system is called the "instantaneous companding pulse code modulation". In actuality, in each data block consisting of a plurality of samples, the maximum level value among the samples within the block is detected, the data within the block are shifted in accordance with the value and are incorporated into the data of the predetermined number of bits, and the resulting data is made the principal data. This system is called the "near-instantaneous companding pulse code modulation" (NIPCM). Along with the principal data, the binary data of the number of bits corresponding to the shift quantity, for example, is sent to the transmitting system as scale information once within one block interval. In this way, a substantially satisfactory analog signal transmission is permitted merely by transmitting one scale information for each data block which consists of the large number of sample data.

One example of such system is shown in FIG. 5 as a system block diagram of a transmission system.

In this case, an input analog signal comprising an audio signal is converted to an original data of a sufficient bit number, such as 15 bits, by a certain time interval, and then the maximum level or the level almost corresponding to the maximum level is detected, thereby providing 4 bit scale information. Then, the original data outputted from the A/D converter 13 is controlled in a digital level and is compressed to 8 bit data. Generally, the level control is conducted by shifting digits, and data compression is conducted by rounding off the lower significant bits. In case where the transmission data is 8 bits, and the scale information is 4 bits, a plurality of 8 bit transmission data, (for example, 32 samples) is composed, with four bit scale information in a composing means 16. The compressed data is transmitted to the transmission system.

When data is transmitted through the transmission line, one scale information is combined with a plurality of transmission data in a time-divisional manner.

The sampling frequency necessary for PCM and a frequency component included in the audio signal are considered. The sampling pulse SP shown in FIG. 6 has a very high frequency of 30 KHz~50 KHz in an ordinary case. A musical signal MS normally has a frequency component of 200 Hz to 3 Kz, and the level ME thereof changes at a conspicuously low frequency such as 0.5 Hz~300 Hz. Thus, even if a single scale information is combined with 32 transmission data, the amount of information of the scale information is not insufficient for transmission line, thereby enabling an efficient transmission. Even if, 100 transmission data are combined with a single scale data, data transmission can be conducted in a normal manner.

In the receiver side, 8 bit transmission data is separated from 4 bit scale data in separation means 17, and digital control of reverse processing namely, bit shifting from the transmission side is conducted, thereby producing an original data of 15 bits, which is converted to an analog data by the D/A converter 19, with the result of an output analog signal quite similar to the original analog data.

The above transmission system will be explained in more detail by reference to FIGS. 7A to 7C.

FIG. 7A shows the original data of 15 bits, in which the shaded portion is the effective bits.

In FIG. 7A, the effective data occupies 6 bits of the original data. Thus, the lower 8 bits of the original data can be made into the transmission data in an unaltered form. In this case, the digit of the eight bit of the transmission data is not changed from the lower bit side, and thus the scale information is "0" in this case. Thus, if the effective bit number is less than 8 bits, the scale information is uniformly kept "0".

In FIG. 7B, the effective data occupies 9 bits among the original data. In this case, if 8 bits are taken as transmission data as described above, the scale information is "1". The effective bit of the lowest digit, namely, LSB (the least significant bit) of the original data, is ignored. Such lower digits of the original data, which are ignored constitute error, namely, difference between the original data and the transmission data, but sufficiently small as compared with the transmission data.

In FIG. 7C, the effective bits occupy all of the original data, namely, 15 bits. In this case, the transmission data of 8 bits is located in such a position as to ignore the lower 7 bits of the original data. Thus, the scale information comes to "7". As is clear from this instance, the maximum amount of shifting is 7 bits.

Accordingly, the number of the scale information is 8 ($2^3$) at a maximum and 3 bits is sufficient to express the scale data. The scale data can be compared with many original data of the prior stage with regard to many orignal data included in a predetermined period. The maximum value of many original data included in a predetermined period is measured or predicted in advance, thereby producing the common scale information (the amount of shifting) applicable to many original data. The scale information can be renewed at every plural data.

In the above description, the transmission data is composed only of data obtained by shifting bits of the original data. In case where analog signals to be processed have only one polarity, namely, either positive or negative, the transmission data may be an off-set binary code. In case where processed analog signals have both positive and negative polarities, a code bit or a bit corresponding to the code is included in the highest bit MSB of the original data (the most significant bit) and a 2's complement code is usually employed. This code bit is substantially an important bit and thus, the code bit of 1 bit should constitute the transmission data as the code bit of 1 bit is included in data obtained through the above-mentioned bit shifting. Thus, if the transmission data is 8 bits, one bit of the 8 bits should be the code bit in case of an audio signal.

In FIGS. 7B and 7C, the data to be added to the lower bits of the 8 bit transmission data in the receiving side is "0".

If the original data is expressed by 15 bits of 2's complement, namely, data as shown in FIG. 8A, the effective bits of 01100101 is extracted as the transmission data of 8 bits and the lower 4 bits are rounded off. Thus, 8 bits are transmitted and one scale information is transmitted at every 32 transmissions of 8 bit data. In the receiving side, the scale data which is transmitted once when the transmission data is transmitted 32 times, is separated at the separation means. The shifting of digits of 8 bit data within one block, namely, the varying of the digital level, is conducted based on the scale information. When the transmission data of 8 bits is subject to the bit shifting in accordance with the scale data, 0 data, (0, 0, 0, 0) is placed on the lower digits as shown in FIG. 8B, resulting in a large amount of error.

However, it is difficult that the conventional near instantaneous companding PCM transmission is applied to the DPCM transmission in an unaltered fashion, as the DPCM can achieve the data compression to a greater extent.

The reason is as follows: It is necessary to decode the received data by performing an integration of the received data. Thus, the error caused by rounding-off operation in the transmitting side is accumulated in the receiving side, thereby causing a great error to be produced. Thus, if the conventional near instantaneous companding system is applied to DPCM without modification, the actual transmission data includes a very large error, although it is intended to lower the average level and to decrease the accumulated errors.

Furthermore, in case a composite signal, formed of more than two signals, such as a higher frequency signal and a lower frequency signal, is inputted, the differentiate value of the higher frequency signal is larger, and the differentiate value of the lower frequency signal is small. The difference, namely, the difference between two differentiate values, are different in proportion to the frequency, even if two input signals have the same input level in amplitude. If the level of the lower frequency signal is smaller than that of the higher frequency signal, even by a small margin, the difference between the differentiate values increase. Thus, one scale information is determined by the high frequency signal and the effective bits of the lower frequency signal which should be transmitted fall into the bit position of digits to be rounded off, thereby sometime failing to be transmitted.

SUMMARY OF THE INVENTION

The present invention is aimed at providing the data transmission system of near instantaneous companding DPCM which does not produce accumulation of errors caused by rounding off data.

The present invention is directed to data transmission system in which a transmission efficiency, or S/N, of a low frequency signal is improved by DPCM and the data compression of the high frequency signal is conducted by a near instantaneous companding method. As the result, the present invention provides the data transmission system in which quantization noise considerably decreases and high accuracy in data transmission is achieved. Further, the present invention can match characteristics of quantization noise to that of auditory sense, thereby obtaining better sound for the ears.

An object of the present invention is to provide the signal transmission system in which, when PCM data or DPCM data is transmitted by a near instantaneous companding method, the bits rounded off are accumulated in the transmitting side, thereby transmitting a carry produced from the accumulation of the rounded-off bits, and thus a sum of data to be transmitted is substantially the same as the original data in respect of accuracy. Another object of the present invention is to provide the data transmission system in which, when DPCM data is transmitted by near instantaneous companding method, the bits rounded off are accumulated to transmit the carry in the transmission side and the DPCM data is accumulated in the receiving side to convert it to PCM data, thereby causing the sum of the received data to be substantially the same as the original data in respect of its accuracy. Still another object of the present invention is to make it possible to transmit DPCM data by near instantaneous method.

Further object of the present invention is to provide data transmission system in which, when PCM data or DPCM data is transmitted by the near instantaneous companding technique, the quantization noise is decreased in the low frequency range, thereby producing better sound for the ears.

Further object of the present invention is to provide the data transmission system in which spectrum of the quantization noise is concentrated in the high frequency range due to the effect of the aforementioned accumulation, and a deemphasis function is conducted in the receiving side to reduce a noise in the high frequency range.

Further object of the present invention is to provide the data transmission system in which DPCM data is transmitted by near instantaneous companding technique, a preemphasis function is conducted in the transmission side to emphasize the high frequency range by performing a differential operation, thereby obtaining DPCM encoded data and the deemphasis function is conducted in the receiving side to deemphasize the high frequency range by performing an integration, thereby obtaining DPCM decoded data.

Still further object of the present invention is to provide the data transmission system in which, when PCM or DPCM data is transmitted by instantaneous companding technique and the rouhded-off data is accumulated, there is provided means for preventing an overflow of the transmission data, thereby achieving the accurate data transfer.

According to the present invention, in the near-instantaneous companding pulse code modulating system, which sends significant upper bits in DPCM data obtained by digitizing, especially the difference of adjacent signal values in case of sampling an original analog signal with "0" and "1" by means of a PCM system, there is a novel digital transmission system in which lacking lower bits are stored in the accumulator, they are added with the lacking bits of the next sending data by the accumulator, and upon the carry of the resultant sum "1" is added to the least significant bit of the next sending data so as to amend this data.

BRIEF DESCRIPTION OF THE DRAWING

FIG. 6 is an envelope characteristic for explaining that DPCM transmission is possible by less data quantity, FIG. 10 is a block diagram of a receiving side of an embodiment of the present invention, FIGS. 21 to 24 are diagrams of bit construction of the embodiment shown in FIG. 20.

PREFERRED EMBODIMENT OF THE PRESENT INVENTION

Various embodiments of the present invention will be explained in detail hereinunder with reference to the draw- ings.

Figure 1:
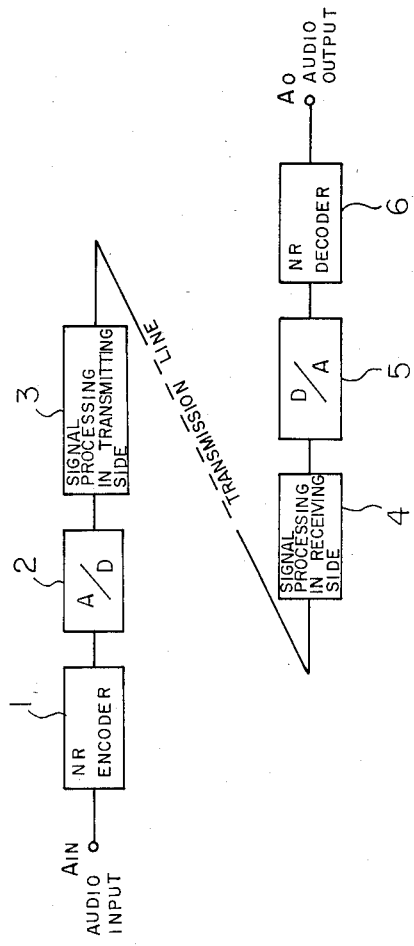
FIG. 1 is a block diagram of the prior art data transmission system to explain a noise reduction method.
Figure 2:
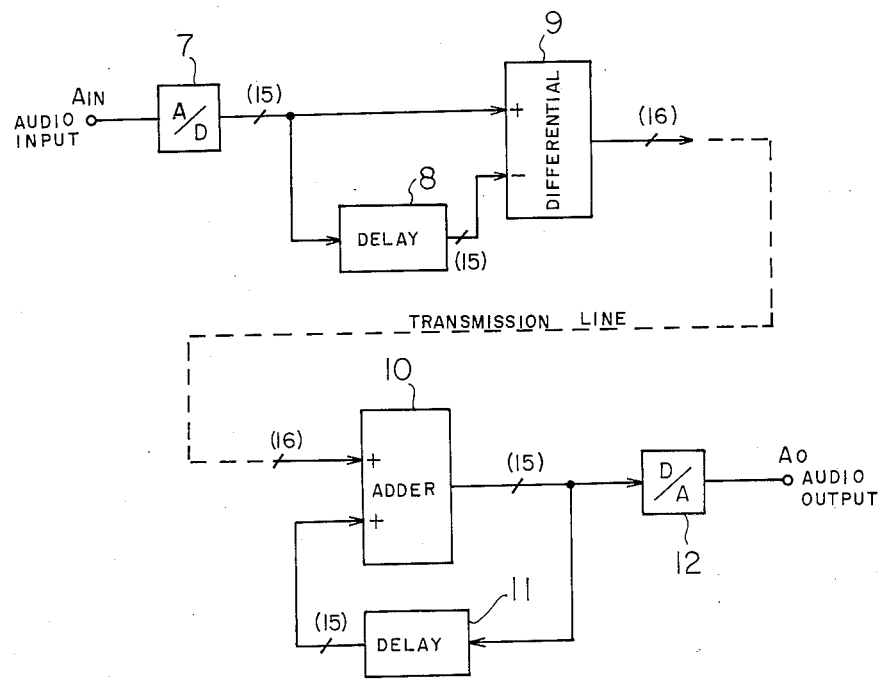
FIG. 2 is a block diagram of one example of DPCM transmission.
Figure 3:
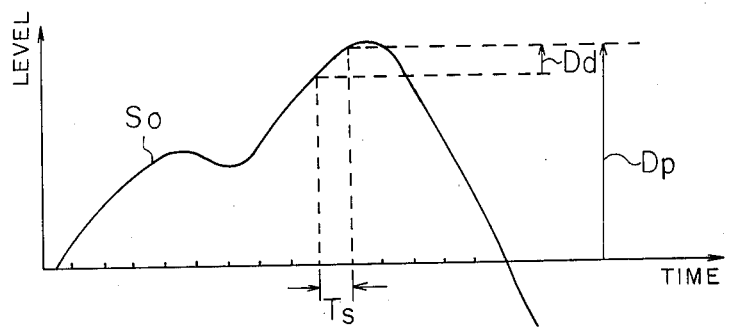
FIGS. 3 and 4 are characteristic diagrams for explaining the difference between PCM and DPCM.
Figure 4:
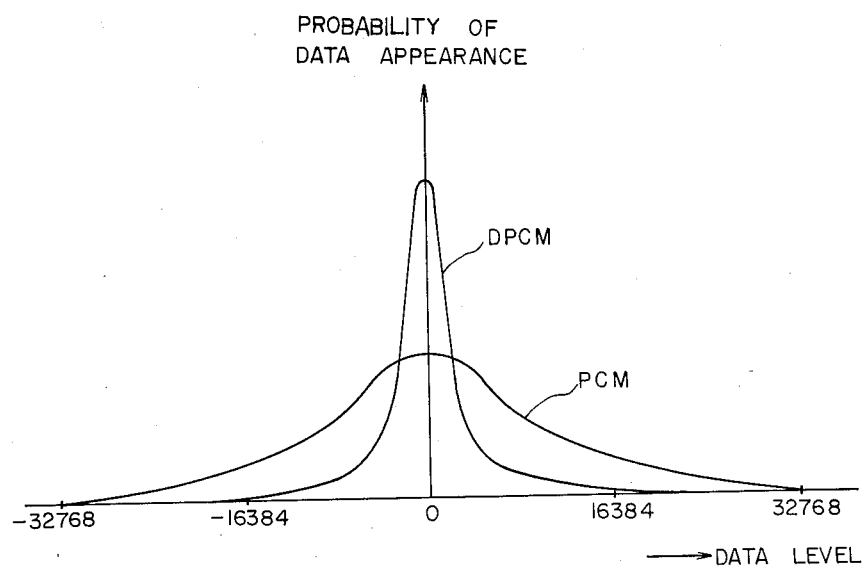
Figure 5:
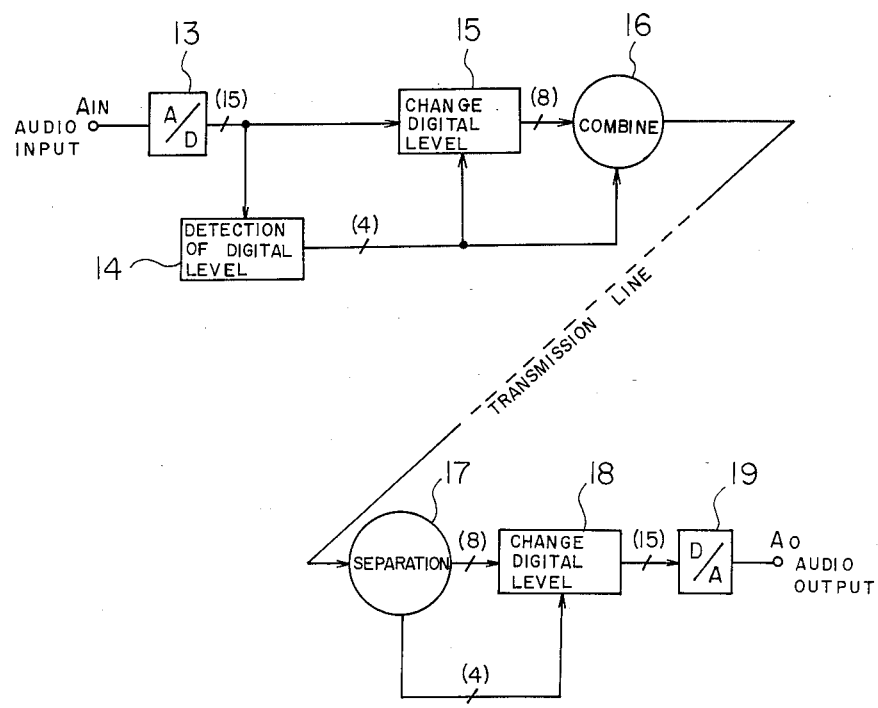
FIG. 5 is a block diagram for showing one example of the data compression by PCM.
Figure 7:
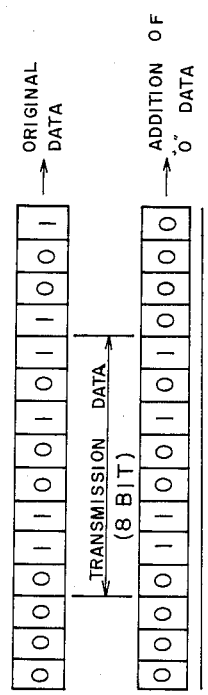
FIGS. 7A to 7B are diagrams of bit construction used in block diagram of FIG. 5, FIGS. 8A and 8B are also diagrams of bit construction used in the block diagram of FIG. 5.
Figure 8:
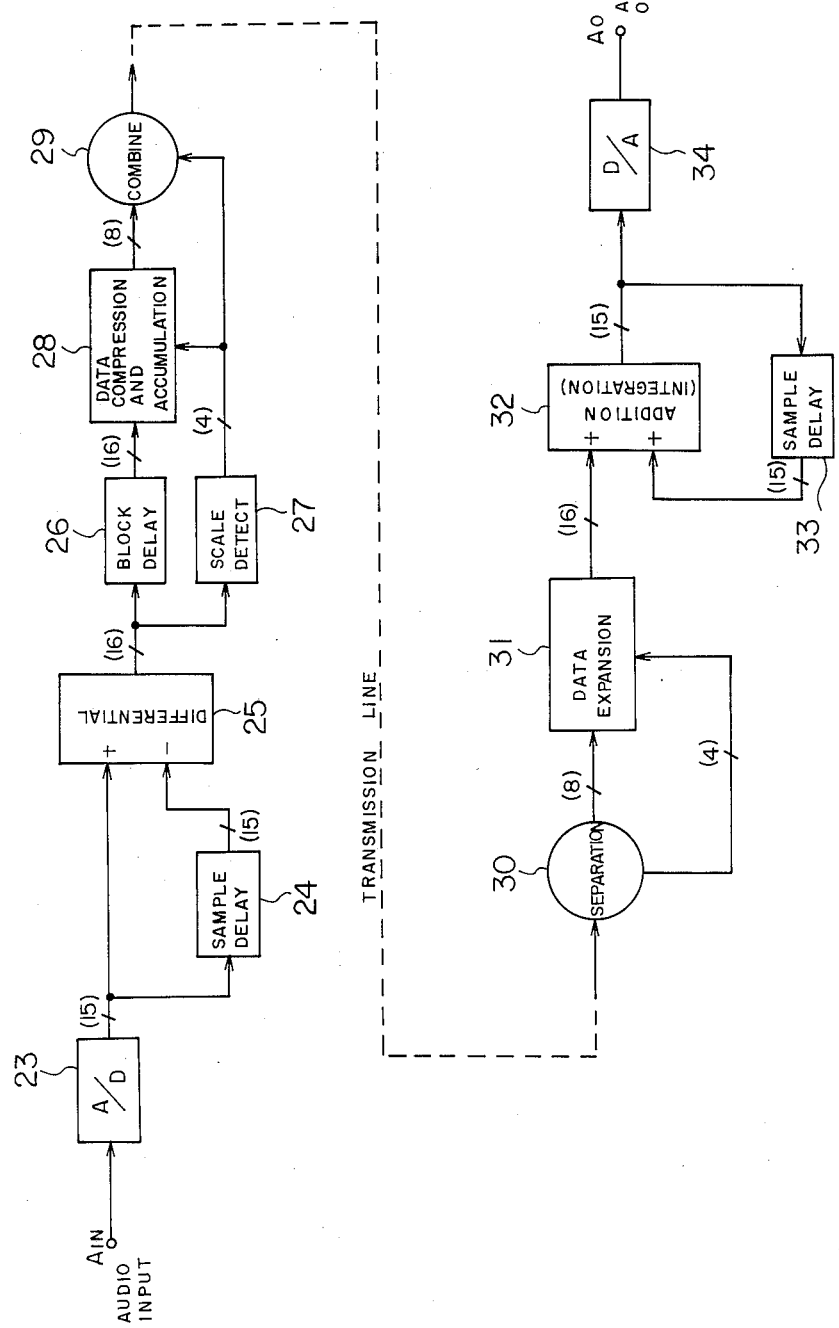
Figure 9:
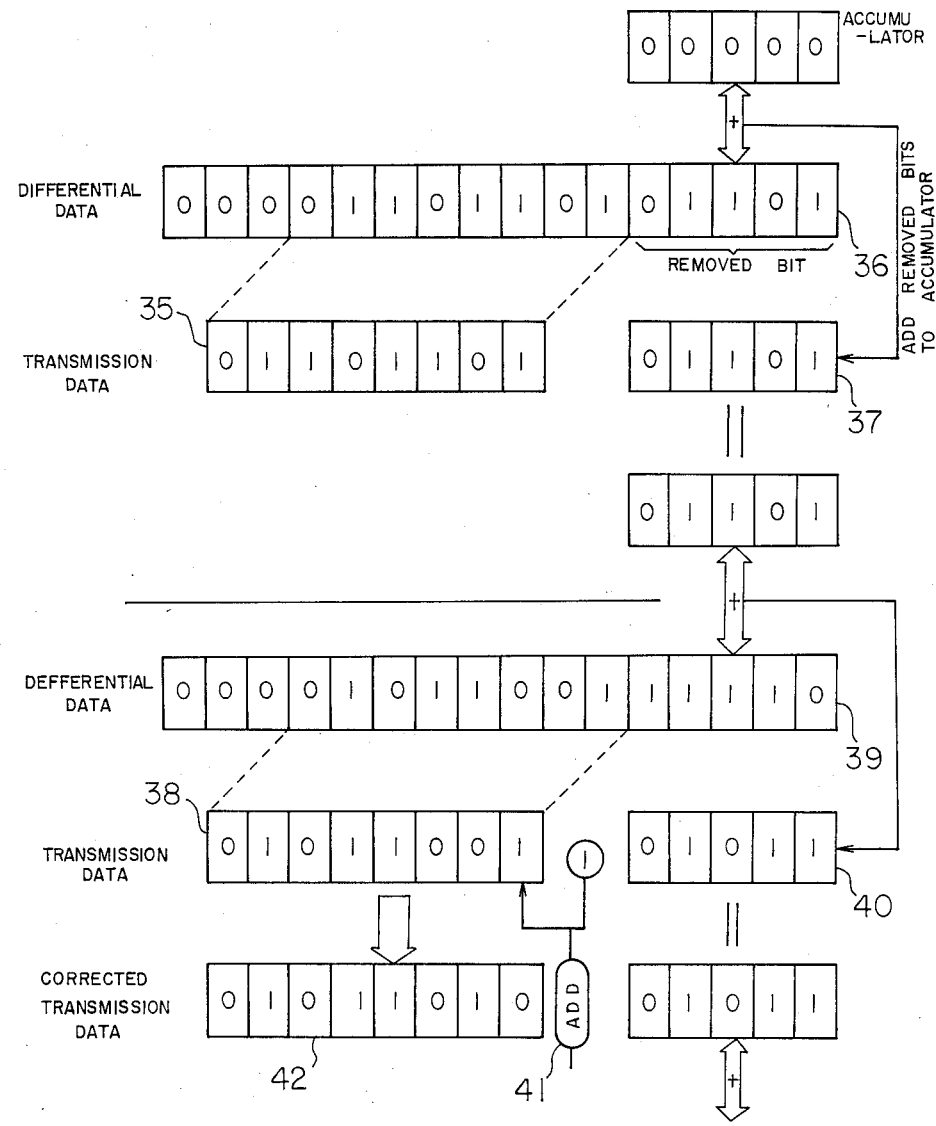
FIG. 9A is a system block diagram of an embodiment of the present invention.
FIG. 9B is a diagram of bit construction for explaining the operation of the embodiment shown in FIG. 9A.

An embodiment of a digital data transmission system according to the present invention is shown in FIG. 9A.

Figure 23:
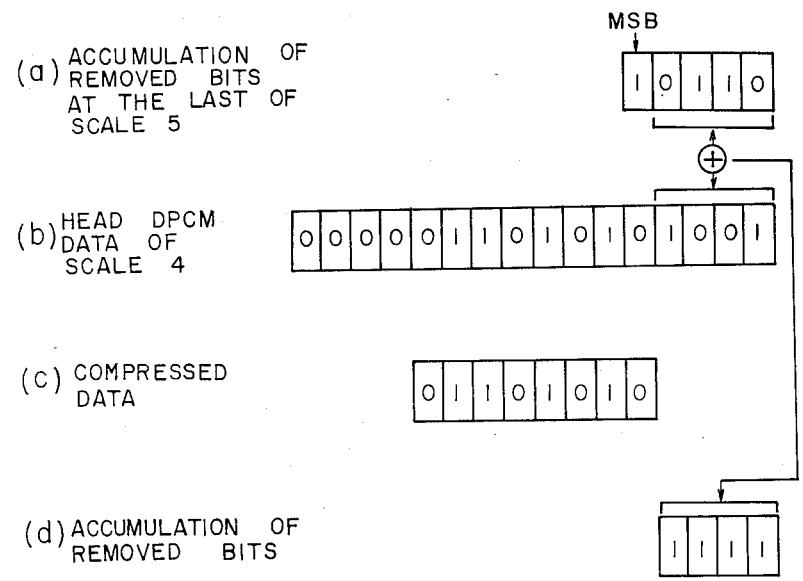

In FIG. 9A, 23 is an A/D converter, 24 is a sample delay circuit for delaying PCM encoded data subjected to A/D conversion by one sample time, and 25 is a differential unit for obtaining the difference between successive two PCM encoded datum, thereby producing DPCM encoded data of 16 bits as the output of the differential unit. 26 is a block delay circuit for delaying DPCM encoded data produced from the differential unit 25 by one data block. 27 is a scale detector for detecting scale information, namely, an amount of shifting for extracting upper 8 effective bits from DPCM data of 16 bits, based on the maximum value of the absolute values of sample datum within one data block produced from the differential unit 25, thereby producing 4 bit data. 28 is a data compression unit constituting a major part of the present invention. The DPCM encoded data of 16 bits delayed by one block in the block delay circuit 26 is shifted in accordance with scale information outputted from the scale detector 27 and renewed by every one block, thereby causing the upper 8 bits to be extracted as the significant transmission data. In the compression unit 28, the lower bits are not completely rounded off and the data rounded off is added to the following DPCM encoded data, namely, the rounded data is accumulated, thereby adding only carry to LSB of the transmission data, thereby avoiding the accumulated error. 29 is a composing circuit in which the transmission data of 8 bits outputted from the data compression unit 28 is combined with the scale information of 4 bits output from the scale detector 27 at a ratio of one scale information to transmission data one block length in a time division manner, thereby producing the composite signal to a transmission line.

The above construction is in the transmitting side and construction of the receiving side is described hereinunder. 30 is separation circuit for receiving the transmitted data and decoding and separating the received data to obtain the transmission data of 8 bits and scale data of 4 bits. 31 is a data expansion unit for shifting the transmission data outputted from the separation circuit 30 in accordance with the scale data and for adding "0", for example, to empty lower bits, thereby forming DPCM received and decided data. 32 is an adder for integrating DPCM received data to produce the PCM data of 15 bits, 33 is a sample delay circuit for delaying the PCM data by one sample time to feed back to the adder 32 and 34 is a D/A converter for performing a D/A conversion of PCM data.

The principle operation of the digital data transmission system described above will be recited by reference to FIG. 9B.

In the bit format of FIG. 9B, the DPCM data obtained by digitizing only the difference of adjacent signal values in sampling the original analog signal with "0" and "1", is composed of 16 bits. In accordance with the magnitude of the digital signal, only the upper significant 8 bits in the 16-bit data, as indicated at numeral 35, are shifted down and sent as principal data (one scale information expressive of the shift quantity is sent for each block), while the lower 5 bits indicated at numeral 36 are stored as lacking bits in the accumulator indicated at numeral 37. When the sending data composed of the upper bits of the next differential data as indicated at numeral 38 is sent, similarly lacking 5 bits 39 are added by the accumulator, and the result 40 is stored in the accumulator. When the sum of the addition has been carried in due time, "1" as a carry input is added to the least significant bit of the sending data, as indicated at numeral 41, whereupon amended 8-bit data indicated at numeral 42 is sent. That is, according to the main feature of the present invention, the data disregarded for reducing the transmission data is accumulated, and when the cumulative data value has reached a quantity significant enough to be transmitted, it is added as the carry to the transmission data, whereby an error can be compensated by the integrator (adder) used for decoding DPCM located on the receiving side.

In the sender shown in FIG. 9A, the scale detector 27 of the present invention extracts the inputted DPCM code data for one block consisting of a predetermined number of samples, obtains the maximum data (the data of the greatest absolute value among plus and minus data) from the DPCM code data of this block and delivers as its output, data of 4-bit scale information (into which the quantity of shift executed when sending the data of 8 bits is extracted from the DPCM data of 16 bits is encoded) corresponding to the maximum difference. The output of the scale detector 27 is updated by every block of DPCM code data.

Meanwhile, the signal of 16 bits entering the block delay circuit 26 has its time deviation compensated therein with respect to the one block of DPCM code data inputted to the scale detector 27 and then enters the data compression unit 28. This data compression unit 28 is also supplied with the scale information data corresponding to the input data and shifts the DPCM code data in accordance with the scale information, extracting the principal data of the upper 8 bits and disregarding the lower bits. On this occasion, the disregarded data of the lower bits is left in the accumulator so as to be added to the next DPCM code data. Thus, the disregarded data is added with the next DPCM code data and is, in effect, included in the later principal data and transmitted through the cumulation of the adding operations.

The signal compressed into the 8-bit transmission data by the data compression unit 28 enters the combination circuit 29. The combination circuit 29 combines the transmission data of 8 bits and the scale information data of 4 bits in, e.g., time division, and delivers the combined data to the transmitting system as the sending data in a bit parallel manner or a bit serial manner, thereby decreasing the total bit number considerably. With a transmission of the bit parallel type, the number of bits of the transmission data can be set at, at most, 8 bits, and the transmitting system may be a transmission line having a capacity of about 8 bits.

Figure 10:
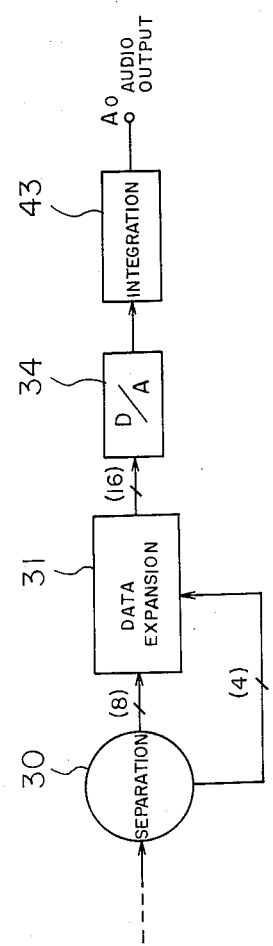
FIG. 10 is a block diagram of a receiving side according to an embodiment of the present invention.

On the other hand, on the receiving side, the separation circuit 30 receives the sending data transmitted by the transmitting system and separates it into the 8-bit principal data and the 4-bit scale information data. The respective separated data enter the data expansion unit 31, in which the 8-bit transmission data in one block is shifted in accordance with the 4-bit scale information and has, e.g., "0" data added to its less significant bits, to become the receiving data of the DPCM code consisting of 16 bits. This receiving data of the DPCM code enters the integrator 32 and is added therein with the data of 15 bits cumulated until that joint, and simultaneously inputted thereto from the sample delay circuit 33, to become the PCM code data of 15 bits. In lieu of digitally executing the integration of the DPCM codes on the receiving side, a system shown in FIG. 10 may well be employed wherein the receiving data of the DPCM code is analogized by a D/A converter 34 so as to be integrated by an analog integrator 43.

Figure 11:
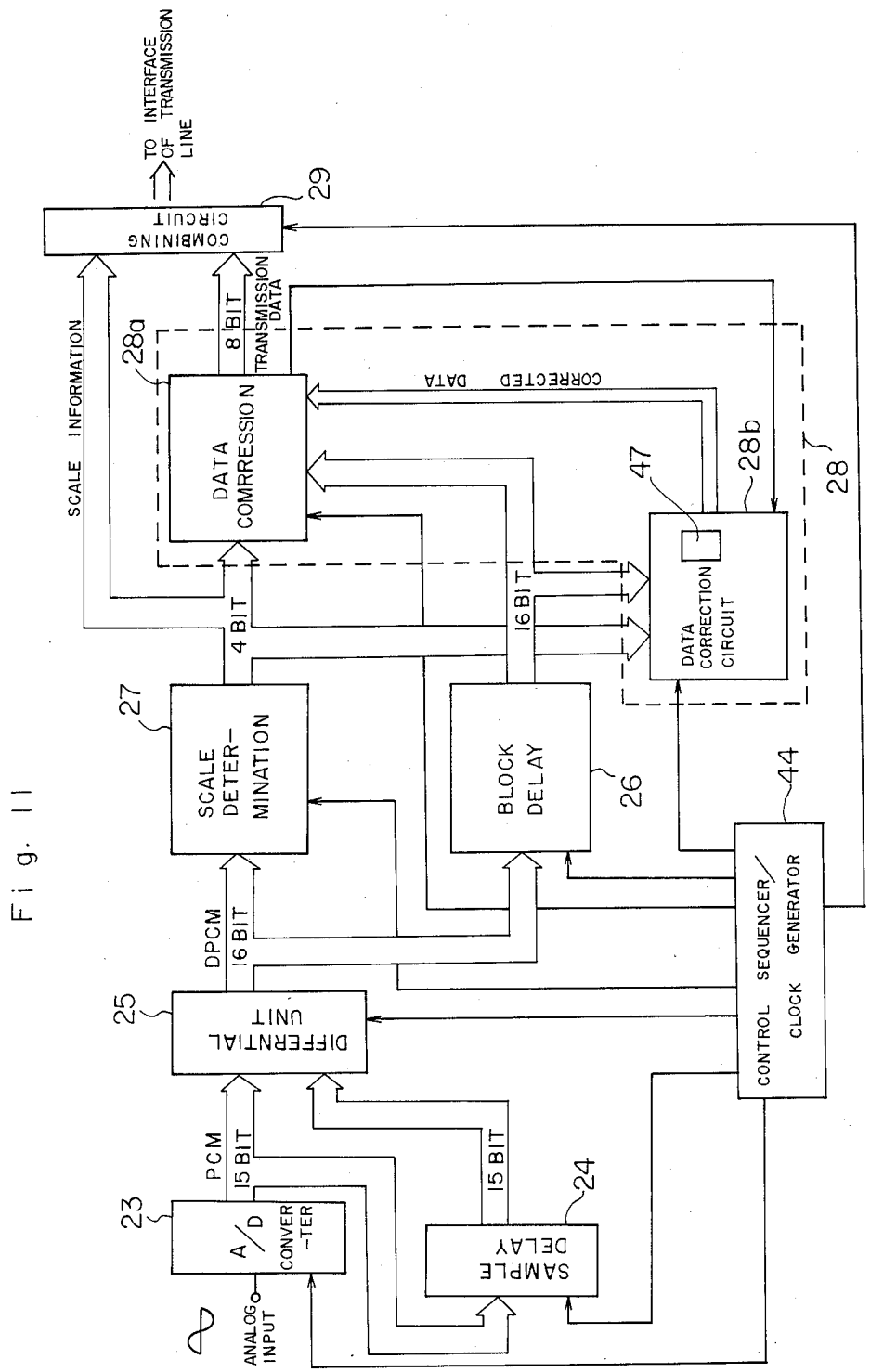
FIG. 11 is a block diagram of a transmitting side of an embodiment of the present invention.

FIG. 11 shows the detailed arrangement of the sending side. Numeral 27 designated the scale determining circuit, which detects the scale value of each data block on the basis of the absolute values of the sample data within the data block from all the data of one block of DPCM code data as delivered from the differentiator 25. For the purpose of preventing the overflow of transmission data to be described later, this scale value is compared with the set scale value of the preceding time, whereupon when the scale value tends to increase, the input scale value is used as a set scale value without any change, and when it tends to decrease, "1" is subtracted from the scale value of the preceding time irrespective of the input scale value, so as to use the difference as a set scale value. The set scale value thus obtained is delivered as output data of 4 bits.

The data compression and correction unit 28 includes a data compressing circuit 28a which serves to compress the DPCM code data of 16 bits into the principal data of 8 bits. It also includes a data compensating circuit 28b. According to this circuit 28b, only those lower-bit remaining data components of at most 8 bits in the DPCM code data, delivered from the block delay circuit 26, which remain when the principal data are derived in accordance with the scale values set by the scale determining circuit 27, are successively applied to, e. g., an 8-bit accumulator and are added for cumulation, and the cumulative result is delivered to the data compressing circuit 28a as amendment data. Shown at numeral 44 is a control sequencer/clock generator unit, which supplies the various portions of the A/D converter 23, sample delay circuit 24, differentiator 25, scale determining circuit 27, data compressing circuit 28a, block delay circuit 26, data amending circuit 28b, and combining circuit 29, with at least one of the control signals and clock signals, in order to operate the respective portions at predetermined timings.

Figure 12A:
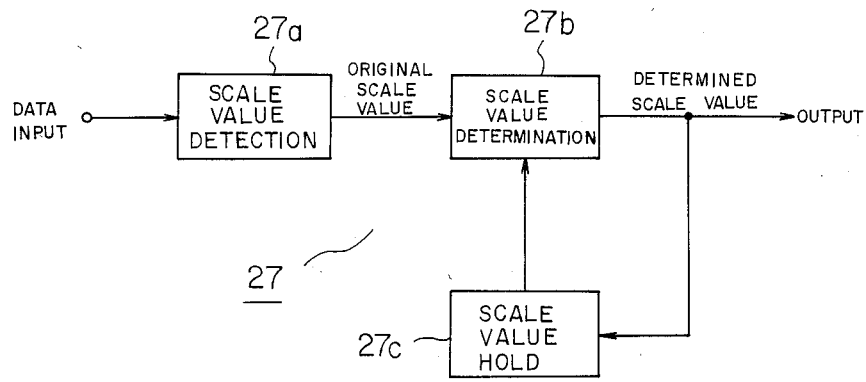
FIGS. 12A and 12B are system block diagram of main portions of the transmitting side of an embodiment of the present invention.
Figure 12B:
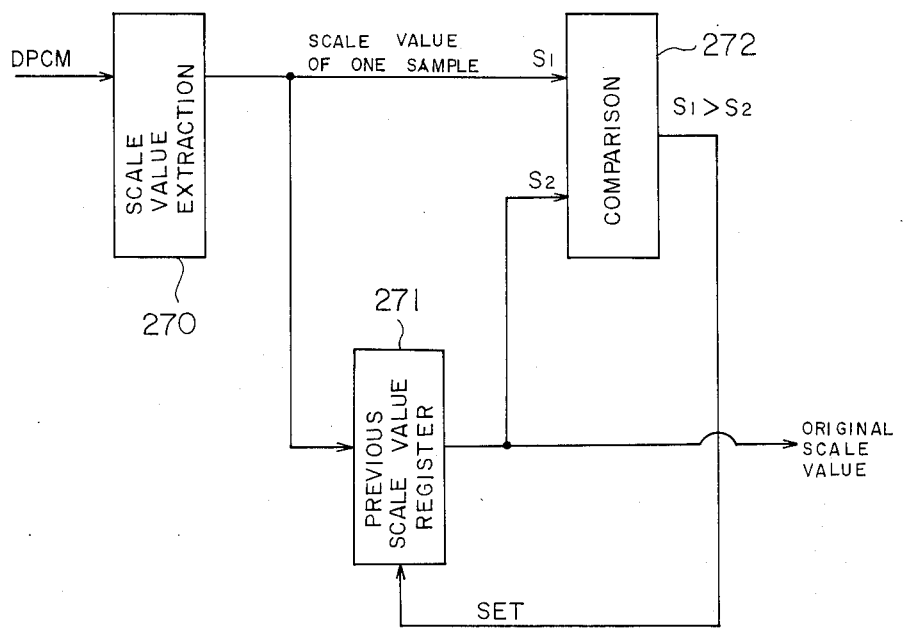

A practicable block diagram of the scale determining circuit 27 is shown in FIG. 12A. Symbol 27a denotes a scale value detecting portion which detects the original scale value based on the maximum data of the absolute value from one block of input DPCM code data as illustrated in FIG. 12B. The maximum value of the scale values within each block is detected by the scale value detecting portion 27a. More specifically, in the arrangement of FIG. 12B, a scale value corresponding to the DPCM data of each sample is extracted by a scale value extracting circuit 270, and the extracted output $S_1$ and a scale value $S_2$ stored in a previous scale value register 271 are compared by a comparator circuit 272 for each sample within the block. Only when $S_1 > S_2$ holds, is the scale value $S_1$ set in the previous scale value register 271. The maximum value of the scale values is obtained in this manner, and it is delivered from the scale value detecting circuit 27a in FIG. 12A as the original scale value within the block. When such maximum values are directly used as set scale values, the respective blocks come to have independent scale values. In contrast, in order to determine set scale values dependent upon one another among the respective blocks, circuits 27b and 27c may well be additionally provided, as shown in FIG. 12A. The scale value setting portion 27b compares the original scale value detected by the scale value detecting portion 27a, with the set scale value of the preceding time, whereupon when both are equal or when the input original scale value is greater, the input scale value is provided as a set scale value without any change, and when the input original scale value is smaller, "1" is subtracted from the previously set scale value irrespective of the magnitude of the original scale value, so as to provide the resulting difference as a scale value. This is intended to prevent the occurrence of the overflow of transmission data to be described later. When the original scale value has the tendency of increasing between the adjacent blocks, it is directly used as the set scale value, and when the original scale value has the tendency of decreasing between the blocks, the value obtained by subtracting "1" from the scale value of the preceding block is selected as the set scale value. The scale value holding portion 27c holds the set scale value delivered from the scale value setting portion 27b, for one block period and affords it to this scale value setting portion 27b again.

Figure 13:
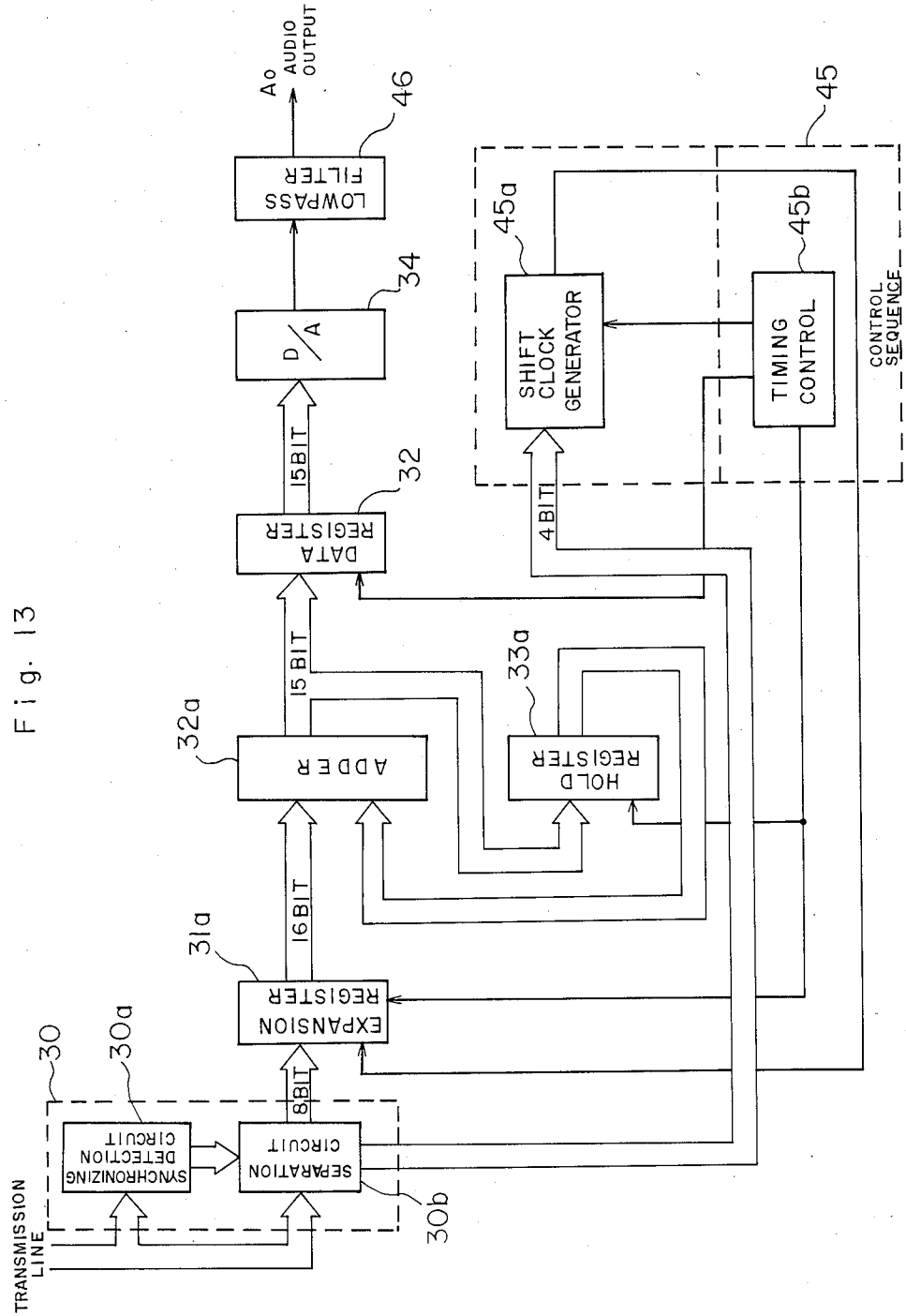
FIG. 13 is a block diagram of the receiving side of an embodiment of the present invention.

The detailed construction of the receiving side is explained by referring to FIG. 13. The received data transmitted from the transmitting side includes 8-bit transmission data comprising DPCM data, scale information of each block and substantially simultaneous block information. The received data is data which is not subjected to any modification, or which is subjected to various digital modulation, such as MFM (modified frequency modulation), bi-phase modulation, 3PM (3 position modulation). Where various digital modulations are applied to data in the sender side, demodulations are applied to such data in the receiver side as a matter of course. The received data is inputted to a synchronizing detection circuit 30a and separation circuit 30b. The synchronizing detection circuit 30a detects a block synchronizing pulse in the received data and produces outputs to the separation circuit 30b in every one block in accordance with the synchronizing pulse. The separation circuit 30b receives the received data at a timing of the block synchronizing pulse, thereby separating 8-bit transmission data from 4-bit scale information in the received data. The separated 8-bit transmission data is applied to the expansion register 31a and 4-bit scale data is added to a shift clock generator 45a in the control sequence portion 45. The scale information inputted to a shift clock generator 45a is converted into the clock number corresponding to the input data and is supplied to the expansion resister 31a. The 8-bit transmission data is converted into 16-bit DPCM data by shifting the transmission data by the number of the above clock. Then, the DPCM received data is applied to the adder 32a and is added to the output of the adder 32a, which is accumulated until of the adder 32a previous to the present data by one sample time is dept in an holding register 33a. The output data of the adder 32a is the integrated (added) data of the DPCM received data, namely, 15 bit PCM data at that time. The holding register 33a and data register 32b hold the output data of the adder 32a and the above both registers can be commonly constructed by using a single register.

In accordance with a timing signal received from a timing control portion 45b, a data register 32b applies the PCM receiving data to the D/A converter 34, by which the receiving data are sequentially converted into analog signals. Unnecessary high frequency components, such as a signal component used for the transmission, are removed from the analog signals by a low-pass filter 46. Then, the original audio signal is derived. In the present system, on the sending side, the lower lacking bits are accumulated, and the carry input is added to the transmission data, whereupon on the receiving side, the occurrence of distortions and quantization noises is suppressed by the cumulating device composed of the integrator 32a and the holding register 33a. As the number of times of data transmission is increased, a higher precision is attained. When 2 data is transmitted, it is equivalent to the transmission of 9 bits, when 4 data is transmitted it is equivalent to the transmission of 10 bits, and when 8 data is transmitted, it is equivalent to the transmission of 11 bits. Assuming by way of example that the lacking bits of the first data and the second data be "11101" and 11000" respectively, the sum of them becomes '110101', "1" of the top bit of which is sent to the receiving side in the form of being added to the LSB of the 8-bit sending data as the carry. That is, when the 2 data are sent, the one bit of the carry of the lacking bits is added to the integrator transmission data of 8 bits. Thus, the output of the 32a of the receiving side is equal to the case where 9 bits are sent. Further, assuming the lacking bits of the third data to be "01000", these are added with the lower 5 bits "10101" of the aforementioned sum "110101", and the sum of the two becomes "11101", so that the carry "0" is sent. On the receiving side, the two carries "1" and "0" are added into a sum S=1+0. Further, assuming the lacking bits of the fourth data to be "10110", these are added to "11101" to produce a sum "110011". "1" of the top bit of this sum is sent to the receiving side as the carry, so that the sum of the carries becomes S=1+0+1=10, which affects both the lower 2 bits of the 8-bit sending data. That is, when the 4 data are sent, the 2 bits of the carry of the lacking bits are added to the transmission data of 8 bits. Thus, when the transmission data is accumulated in the receiving side, it become equivalent to the case where 10 bits are sent. This indicates that, when viewed in the direction of time, data corresponding to 9 bits can be sent by sending 2 data to the transmission line of 8 bits, and data corresponding to 10 bits can be sent by sending 4 data. That is, even with the transmission line of 8 bits, as a larger number of data are sent, data of an increasing number of bits above 8 bits are sent equivalently, and errors can be compensated. Thus, when data numbering 28 are sent, the original PCM data of 16 bits can be equivalently sent with the transmission line for the transmission data of 8 bits. In other words, even the information items of the lower lacking bits disregarded and left untransmitted and unreceived in the one sending operation of the DPCM data are transmitted through the carry or borrow to or from the upper bits, i.e., the transmission data as the DPCM data are sent twice, three times, etc. By accumulating (integrating) these transmitted data approximate the exact data. This means that the lower frequency signal is transmitted effectively. Because, even if correct value is transmitted with a certain delay, the meaning of such transmission of delayed correct value becomes weaker in case of a higher frequency signal. On this occasion, the accumulator composed of the integrator 32a and the accumulation holding register 33a corresponds to the integration, and the DPCM receiving data are passed through the accumulator so as to reduce distortions.

According to the present invention, therefore, the average level of transmission data can be lowered by the DPCM. Further, the lower lacking bits are accumulated on the sending side, and the carry data is added to the sending data, whereby errors can be reduced. Moreover, one scale information is transmitted in data block unit, whereby data can be transmitted very efficiently with a small number of transmission bits.

Figures 14, 15:
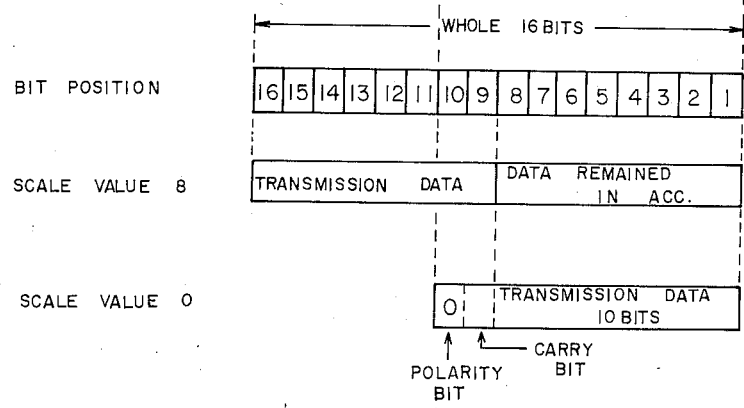
FIGS. 14 and 15 are diagrams of bit construction of an embodiment of the present invention.

A problem in such digital transmission apparatus according to the present invention is the overflow of transmission data ascribable to the accumulation of the lower lacking bits. A case where another overflow arises is illustrated in FIG. 14, which will now be referred to. Let it be supposed that, as the result of the accumulation of the lower bit remaining data, data "011001" be left in the accumulator as indicated in (a) of FIG. 14. Assuming now that the scale value as the shift quantity correspond to the number of the lower lacking bits, this scale value is '6' when DPCM code data "0001101001010010" is given as indicated in (b) of the figure, both the data are added to produce data "0001101001101011" as indicated in (c). Since the scale value is still '1 6' at this time, data "01101001" indicated in (d) is transmitted as the principal data. Accordingly, data "101011" indicated in (e) remains in the accumulator. In this status, the particular data block ends. It is assumed that data "0000000011011010" indicated in (f) be given at the beginning of the next data block, while at the same time the scale value change to '1'. In this case, the result of the addition in the accumulator becomes "0000000100000101" as indicated in (g) of the figure. If the transmission data to be derived is data of 8 bits, it becomes "10000010", and the polarity is inverted at the 2's complement etc. to incur a great error. When the scale value has suddenly decreased from '6' to '1' in this manner, the previous content of the accumulator (FIG. 14, (e)) is not sufficiently smaller than the original data given (Fiq. 14, (f)), and hence, the added result (FIG. 14, (g)) overflows from the predetermined scale value 1'. Therefore, if the transmission data of 8 bits is extracted in accordance with the given scale value '1' and then transmitted, the most significant bit of the transmission data becomes "1", and the data becomes minus.

In such case, according to the present invention, the number of bits of only the first transmission data in one block is set at 9, whereby the error is effectively prevented.

More specifically, since the data of 9 bits is extracted and transmitted as the transmission data, "010000010" indicated in (h) of FIG. 14, becomes the transmission data. Since the scale value is '1 1', data "1", indicated in (i) of the figure, remains in the accumulator as the lower bit remaining bit.

After the number of bits has been set at 9, only at the beginning of the block, in this manner, the number of bits in the accumulator is one corresponding to the scale value, and the data in the accumulator becomes sufficiently smaller than the transmission data, so that the overflow scarcely occurs. Herein, the decrease of the transmission efficiency is very slight because the one bit increases for one block. For example, in a case where one block consists of 32 samples, the transmission data quantity of the one block becomes 8 bits×32+4 bits (scale information)=260 bits without applying the present invention, and it increases by one bit and becomes 261 bits in the present embodiment. Accordingly, the rate of decrease of the transmission qfficiency is below 0.4% per block, which poses no problem in practical use.

In the above, the case has been stated where the scale value changes from '6' to '1'. However, when in a case similar to the above, the maximum variation of the scale value in the decreasing direction of data is still larger, there is such occasion that the increment of the bit length of the first data in a block needs to be made greater than in the foregoing case.

For example, when the scale value has changed from '8' to '0', the first transmission data of the block must be set at 10 bits, which are 2 bits longer than the other transmission data. More specifically, as illustrated in FIG. 15, data to be left in the accumulator at the last of the block, as to which data of 8 bits has been extracted from the original data of 16 bits in accordance with the scale value '8', and then transmitted, includes at most 8 bits. In a case where this data is added to the first original data of the next block of scale information '0' to induce a carry, the polarity information of the 2's complement appears in a bit above the tenth bit as reckoned from the LSB. Accordingly, when the scale value has become '0' in this status, the aforementioned polarity information cannot be sent unless the transmission data is set at 10 bits.

In this manner, the increment of the number of transmission bits of the first principal data of the block needs to be 2 bits in some cases and 3 bits in the other cases. The value of the increment, however, is determined by the numbers of bits of the original data and the principal transmission data, so that it can be limited to one bit or set at two or more bits by design.

While, in the above, the case where the DPCM code data being the raw data is transmitted as the 2's complements has been described, substantially the same as the foregoing applies to a case where the code of the raw data is the ordinary binary code or any other code.

The above embodiment has been described as merely increasing the number of bits of the first principal transmission data of the data block. Since, however, the overflow arises at the decrease of the scale value, increase in the number of bits of the transmission data may be designed at a small value by imposing the limit on the decreasing direction of the scale value, as described before.

In this design, the transmission signal from the transmitting system enters the receiving circuit 30, as shown in FIG. 13, and the receiving circuit 30 may separate the transmission signal received from the transmitting system, into the transmission data of 8 bits and the scale information data of 4 bits, the transmission data having 9 bits only at the beginning of the block.

In this way, the occurrence of the overflow attendant upon the fluctuation of the scale value can be very effectively prevented in the case of the data compression on the sending side.

In the sending circuit of FIG. 11, the functions of the data compressing unit 28, which is constructed of the data compressing circuit 28a and the data correcting circuit 28b, including the accumulator, may well be performed by another arrangement, for example, one in which the detection of carry information for the transmission data compression based on the accumulation of the lacking bits, and the extraction of transmission data from present preliminary conversion data, are executed in parallel by respective different portions.

Next, the overflow within a block will be explained. The above-described overflow extends over blocks and results from the decrease of the scale information. An overflow explained in the following arises within a block and does not have relation to a change of scale information.

Figure 16:
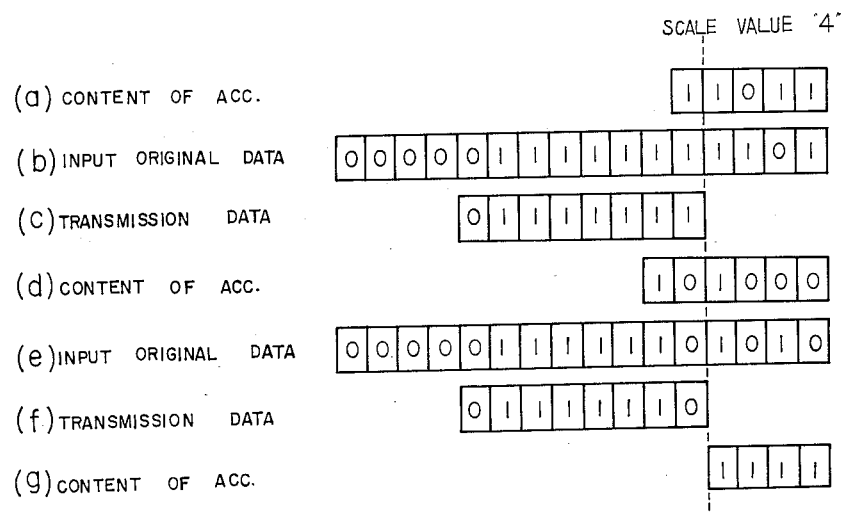
FIG. 16 is a diagram of bit construction of an embodiment of the present invention.

FIG. 16 elucidates the overflow in a block in this case. It is assumed by way of example that the scale value be '4' and that the content of the accumulator, namely, the lower bit remaining data cumulated, be "11011" as indicated in (a) of FIG. 16. Since the accumulator produces a carry corresponding to fifth bit, the carry thereof should be added to LSB of the next transmission data, thereby extracting the corrected transmission data. However, assuming that the input original data given on this occasion be "0000011111111101" as indicated in (b) of the figure, the addition of the carry of the accumulator results in the overflow of the corrected transmission data. Therefore, in such case, as indicated in (c), the data "01111111" of the compressed transmission bit positions of the original data is directly used as the transmission data without executing the addition. At this time, the logic of the accumulator is not modified at all, and the lacking component "1101" involved in the compression of the original data is added to the previous content of the accumulator to produce a value "101000", as indicated in (d). If the next value of the original data does not cause an overflow when the value of the accumulator is added thereto, an ordinary adding can be conducted. Further, it is assumed that also the next original data has a large value "0000011111101010", which is indicated in (e) and which cannot be added without an overflow In the case where such original data, which cannot be added without the overflow to the transmission bits have been successively received the data "01111110" of the transmission bit positions set by the scale value of the original data as indicated in (f), is transmitted without executing the addition of the original data to the accumulator content. Moreover, the accumulator logic is modified, for example, the content of the accumulator is substituted by "1111" in which all the lacking bits are "1" as indicated in (g), thereby making it possible to process the addition with the normal accumulator logic at the next time without fail.

Even in this case, the precision of transmission by 8 bits is not spoilt at all, and merely the function of the accumulator for attaining, in effect, a precision corresponding to more bits, is stopped for a moment. Thus, the occurrence of the serious situation of the overflow can be avoided.

Figure 17:
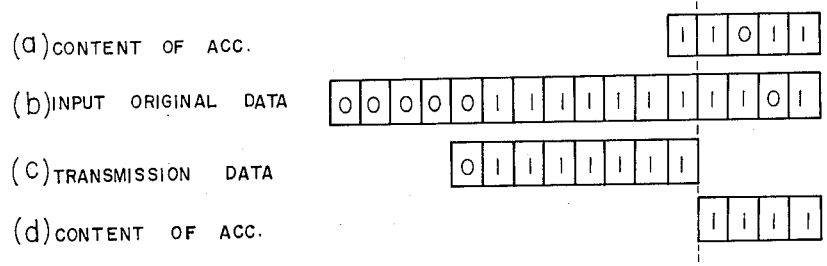
FIG. 17 is a diagram of bit construction of an embodiment of the present invention.

In an embodiment of FIG. 17, in the case where the data which cannot be added to the accumulator content without the overflow to the transmission data has been given, the accumulator logic is deliberately modified as soon as the addition is stopped.

More specifically, it is assumed that original data "0000011111111101", indicated in (b) of FIG. 17, be given when the scale value is '4', and the content of the accumulator is "11011", indicated in (a) of the figure. In this case, the addition results in an overflow. Therefore, the addition to the accumulator content is not executed, and transmission data "01111111" is extracted directly from the original data and is transmitted as indicated in (c), while at the same time the content of the accumulator is changed into "1111" as indicated in (d), so as to perform the subsequent processing. The evil influence of the overflow can also be avoided in this way. Further, the probability of occurrence of such situation is low and it is little worth consideration.

Figure 18:
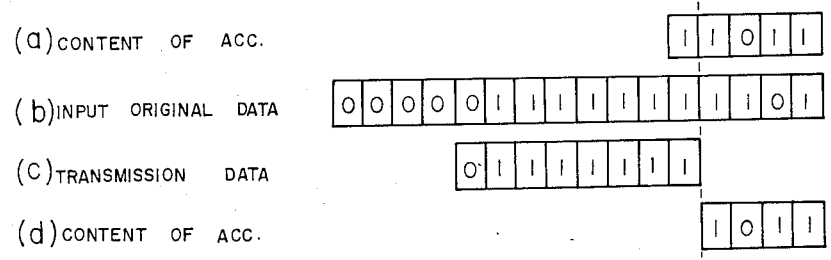
FIG. 18 is a diagram of bit construction of an embodiment of the present invention.

In an embodiment of FIG. 18, in the case where the original data which cannot be added with the accumulator content without the overflow to the transmission data has been given, the accumulator logic is deliberately modified, and all the lacking bits of the data are deleted.

More specifically, assuming that original data "0000011111111101", indicated in (b) of FIG. 18, be given when the scale value is '4' and the content of the accumulator is "11011" as indicated in (a) of the figure, the addition results in an overflow. Therefore, the addition to the accumulator content is not executed, and transmission data "01111111" is extracted directly from the original data and is transmitted as indicated in (c), while at the same time the accumulator content has its top bit '1' removed into "1011" as indicated in (d), so as to perform the subsequent processing.

In this case, in lieu of the lacking bits of the accumulator, the lacking bits of the raw data given anew may well be used as data to be left in the accumulator for the subsequent processing.

Figure 19:
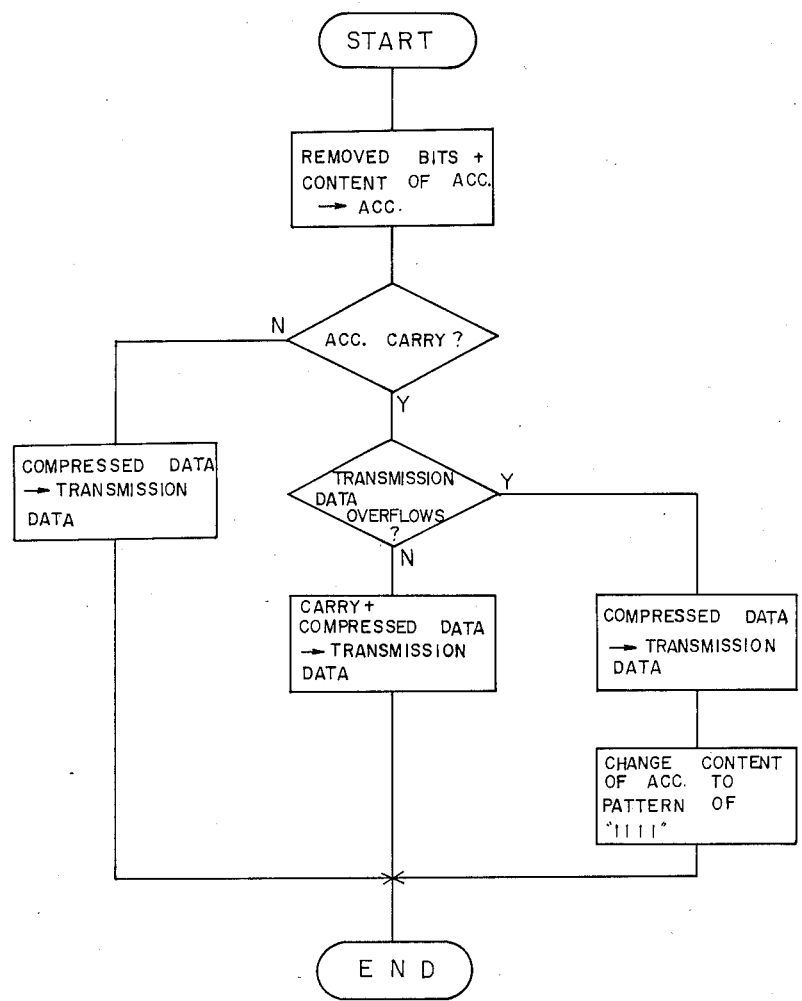
FIG. 19 is a flow chart of an embodiment of the present invention.

The logic of FIG. 17 will now be described with reference to a flow chart shown in FIG. 19.

In encoding given original data, data corresponding to the lacking bits thereof is added to the content of the accumulator, and the result is stored in the accumulator. At this time, whether or not a carry arises in the accumulator is decided. In the case where the carry does not arise, compressed 8-bit data of bit positions conforming with a scale value corresponding to the transmission bit positions of the original data, is set as transmission data without any change. In the case where the carry arises, whether or not the addition of this carry results in the overflow of the above compressed 8-bit data is decided. If the overflow does not take place, data obtained by adding the carry to the compressed 8-bit data is set as transmission data. If the overflow takes place, the aforementioned compressed 8-bit data is directly used as transmission data, while at the same time the content of the accumulator is forcedly changed to such status that all bits thereof are "1". Thus, instead of adding a carry to the transmission data, the content of the accumulator is changed to the maximum value, namely, "1111".

Figure 20:
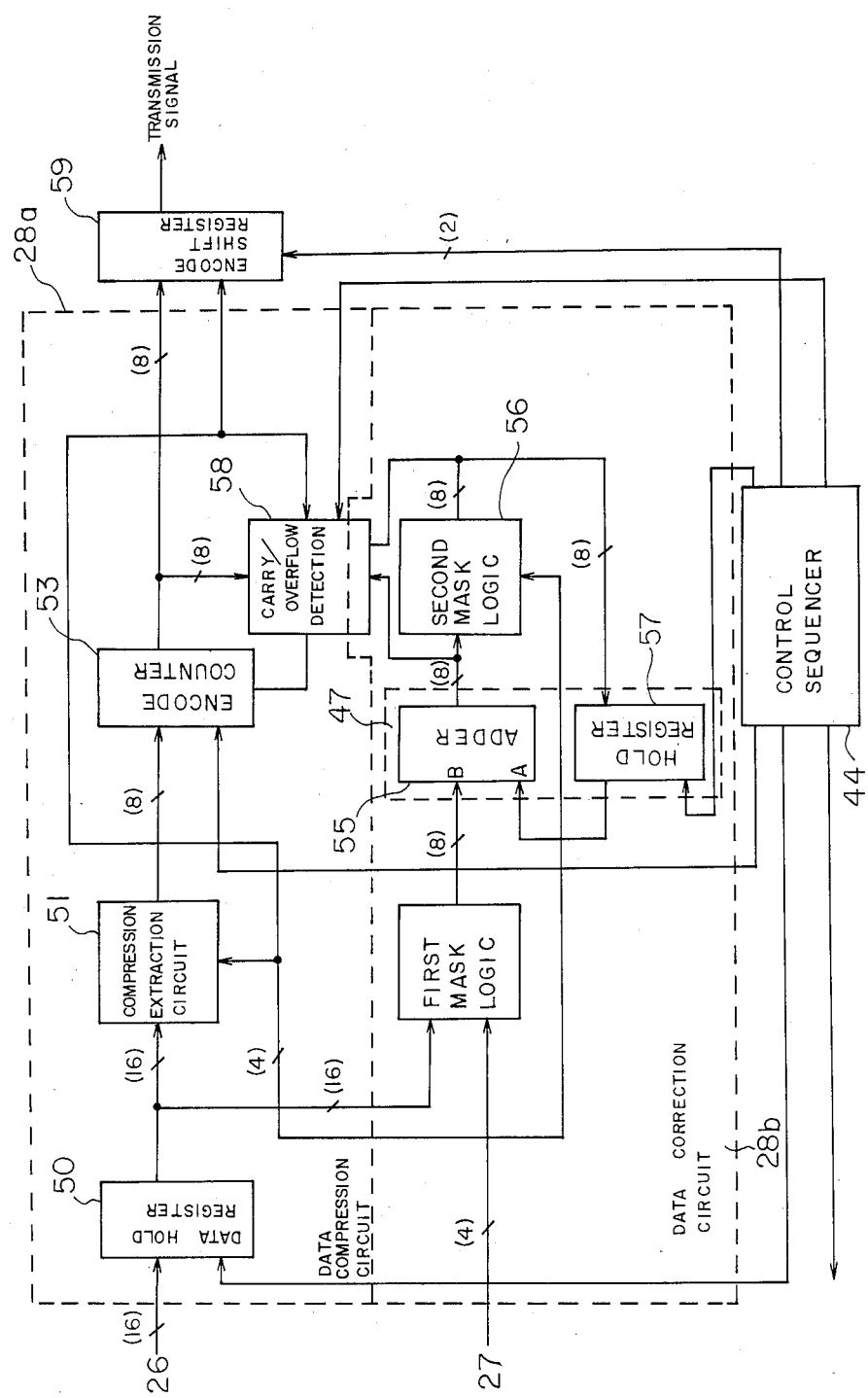
FIG. 20 is a system block diagram of an embodiment of the present invention.

Referring to the sending unit of FIGS. 11 and 20, the data correction circuit 28b is provided with an circuit, which serves to execute the processing of the overflow conforming with the flow chart. The scale output of 4 bits from the scale detecting circuit 27 enters the data compressing circuit 28a, to which the DPCM code data delayed by one block is also applied from the block delay circuit 26. The compressing circuit 28a has an adder 28a 1 for adding a carry outputted from the data correction circuit 28b to the transmission data of 8 bits, and the transmission data of 8 bits is extracted from the DPCM code data of 16 bits received from the block delay circuit 26, at bit positions corresponding to the scale data of 4 bits received from the scale detecting circuit 27. The amending circuit 28b determines the bit position of the lacking bits, in the case of the extraction of the 8-bit transmission data and these are added to the content of the accumulator 47. Here, when a carry to the transmission bits has occurred, the carry information is delivered to the data compressing circuit 28a. However, this is the case where it is determined by the data amending circuit 28b such pattern "01111111" does not exist at the position of the transmission data. Then, the carry of the above-mentioned accumulator is added to the compressed 8-bit transmission data at the adder 28a-1, thereby forming the transmission data. The above-recited accumulator 47 comprises an adder 55 and holding register 57 as shown in FIG. 20.

If it is judged that data "01111111" exists in the transmission data and the carry is produced from the accumulator 47, the above-mentioned overflow occurs. Then, the carry is not transmitted to the data compression circuit 28a. Instead of it, the content of the accumulator 47 is replaced by the pattern "1111", which is kept in the accumulator 47. This pattern "1111" is outputted from a carry/overflow detection circuit 58 and the pattern "1111" is stored in the holding register 57 in place of the output of the adder 55. Thus, the data compressing circuit 28a produces the compressed data as the transmission data as it is. This control is executed at a timing produced from the control sequencer 44.

As described above, the data correction circuit 28b determines a position of the transmission data based on data supplied from the block delay circuit 26 and from the scale determining circuit 27, examines whether the pattern "0111 . . . " exsist at the position of transmission data and decides whether the accumulator 47 produces a carry or not. As a result, if it is determined that the overflow condition is not established, the accumulator 47 continues an ordinary operation. On the other hand, if it is decided that the overflow condition has been established, the content of the holding register 57 is replaced by the maximum pattern, namely, "1111" simultaneously, the carry being produced is suppressed by a second mask logic 56.

The processing of the overflow will be explained more in detail by referring to FIG. 20, in which the data compression portion 28 comprising data compressing circuit 28a and data correction circuit 28b, and circuits located around the data compressing portion 28 in a form of a block diagram. 50 is a data hold register for holding DPCM encoded data of 16 bits read out from block delay circuit 26 comprising a delay memory and the output of the data hold register 50 is applied to a compression and extraction circuit 51. The compression and extraction circuit 51 comprises a multiplexer and extracts 8-bit transmission data from 16-bit DPCM data kept in the hold register 50 in accordance with the scale value. 53 is an encode counter comprising a binary counter of 8-bit length which can preset a value of starting a count in a parallel load manner, and receiving 8-bit transmission data outputted from the compression extraction circuit 51. 54 is a first mask logic comprising a gate circuit for transmitting only bits corresponding to the rounded-off lower bits among the maximum rounded-off value of 16-bit DPCM encoded data kept in the data hold register 50 in accordance with the scale value produced by the scale value supplied from the scale value detector 27, to the adder 55. The adder 55 calculates a sum of the rounded-off bit B at that time and the accumulation A of the rounded-off bits and delivers it to a second mask logic 56. The second mask logic 56 comprises a gate circuit and suppresses a carry bit position, namely, a position at which a carry is produced, to "0", based on the output content of the adder 55 in accordance with the scale value. A total and accumulated sum of rounded-off bits outputted from the second mask logic 56 is applied to a holding register 57. The total and accumulated sum of the rounded-off bits stored in the holding register 57 is added to the adder 54 in accordance with load clocks produced from the control sequencer 44. Namely, as stated above, the adder 55 and the holding circuit 57 constitute the accumulator 47. The carry/overflow detection circuit 58 comprises a gate circuit the output of which becomes active when a carry bit "1" is produced from the output data of the adder 55, the carry being data supplied to 8-bit transmission data from a rounded-off data in accordance with 9 scale value and at the same time, the bit pattern of 8-bit transmission data outputted from the encode counter 53 is "01111111". When this overflow condition is not established one up-count clock is supplied to the encode counter 53. When the overflow condition is established, the dection of the carry is disregarded and simultaneously, the pattern "1111" is applied to the holding register 57. The carry of the accumulator 47 comprising the adder 55 and holding register 57 is suppressed by the second mask logic 56. 59 is an encode shift register constituting a part of the transmitting side. The encode shift register 59 converts 8-bit transmission data delivered from the encode counter 53 and the scale value delivered from the scale detection circuit 27 into serial data and forms a time-divisional multiplex signal.

In this manner, the carry/overflow detecting logic 58 receives the 8-bit transmission data from the encode counter 53 in order to check if a carry appears at a bit position corresponding to the least significant bit of the 8-bit data, and it acknowledges if the 8-bit data pattern is "01111111", indicative of the overflow condition. Only when the carry appears and also the overflow condition does not hold, an upcount clock which is produced from the control sequencer unit 44 at a predetermined timing is impressed on the encode counter 53 so as to subject the count data of this encode counter to '+1'. In this manner, an accumulation function of the data correcting circuit 28b and a carry function of the data compressing circuit 28a are separated, whereby the respective functions can be executed very simply.

FIG. 21 illustrates the processing steps of the above embodiment.

(a) of FIG. 21 shows DPCM code data of 16 bits obtained by taking the difference of PCM code data items. On this occasion, the scale value is assumed to be '5'. The cumulative value of lacking bits indicated in (b) of the figure is added to the DPCM data, to obtain added result data indicated in (c). A predetermined bit component conforming with the scale value as indicated in (d) is extracted from the added result data, and is transmitted as compressed data.

Figure 22:
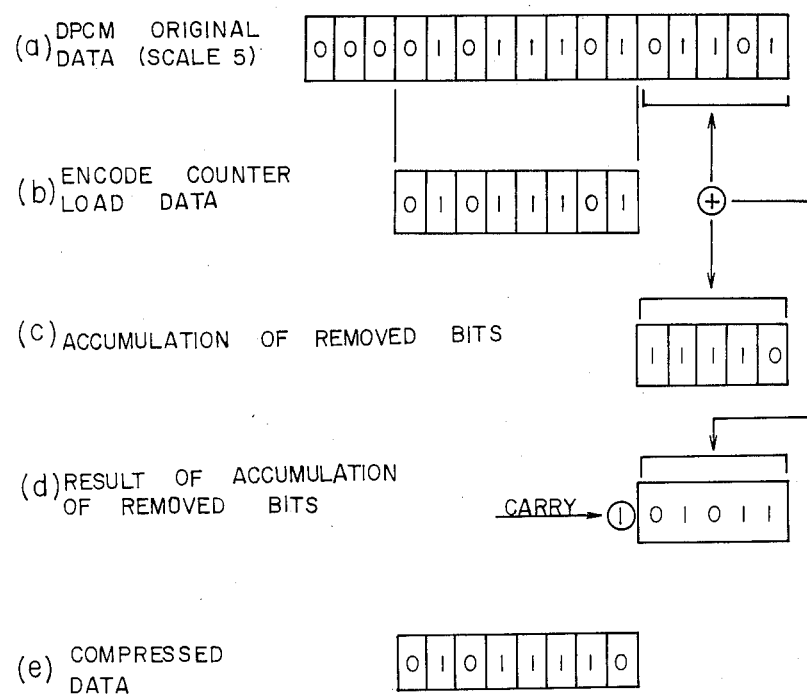

Meanwhile, in the present embodiment, data of 8 bits, at bit positions conforming with a scale value '5', as indicated in (b) of FIG. 22, is extracted from DPCM data of the scale value '5' indicated in (a) of the figure (the data is the same as shown in (a) of FIG. 21). The extracted data enters the encode counter 53. At the same time, the lacking lower bits of the DPCM data in (a) are added with the cumulative value of the lacking bits indicated in (c), to produce an added result indicated in (d). The added result induces a carry which subjects the encode counter 53 to '+1'. At this time, the 8-bit data "01011101" does not meet the overflow condition. Therefore, transmission data of 8 bits shown in (e) is obtained. However, an exceptional operation to be described below needs to be taken into consideration.

(a) of FIG. 23 illustrates the cumulative data of lacking bits after the last data of a block having a scale value '5' has been processed, while (b) of the figure illustrates the first DPCM data of a block in the case where the scale value has changed in the decreasing direction and has become '4'. In this case, when both the data are added in accordance with the sequence described before, compressed data indicated in (c) and lacking bit cumulation data indicated in (d) are obtained. At this time, "1" of the MSB shown in (a) is disregarded. The reason is that the MSB cannot pass through the second mask logic 56. In such case where the MSB of the lacking bit cumulation data is "1" and where the scale value has changed in the decremental direction, the head data exceptionally requires a sequence for absorbing the aforementioned MSB of the lacking bit cumulation before the normal sequence of the lacking bit cumulation starts.

Processing steps in the case of incorporating the exceptional processing will now be described with reference to FIG. 24.

Figure 24:
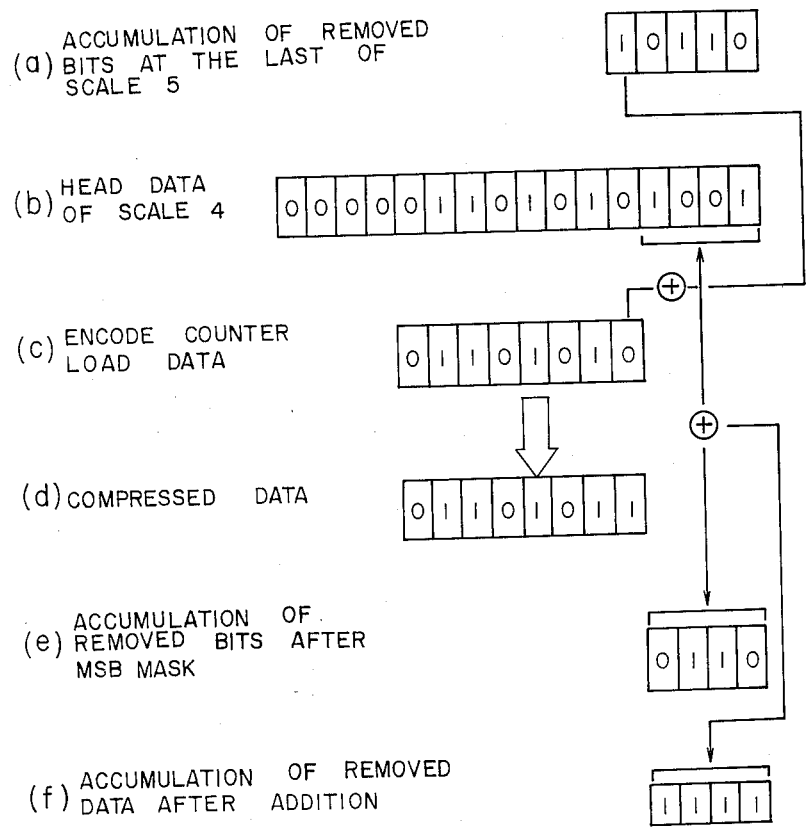

(a) and (b) of FIG. 24 are the same as those of FIG. 23, respectively. (c) of FIG. 24 is similar to that of FIG. 23, but the illustrated content is the load data of the encode counter 53. (d) of FIG. 24 shows compressed data obtained as the result of the exceptional processing, in other words, by adding the MSB of the lacking bit cumulation in (a) of FIG. 24 and the content in (c) of the figure. That is, under the condition that the MSB of the lacking bit cumulation in (a) is "1", the encode counter 53 is incremented or the data in (c) is subjected to '+1'. (e) of the figure illustrates lacking bit cumulation data obtained by masking the MSB in (a), while (f) illustrates lacking bit cumulation data obtained by adding the lacking bits of the DPCM code data in (b) and the lacking bit cumulation in (e).

Figure 25:
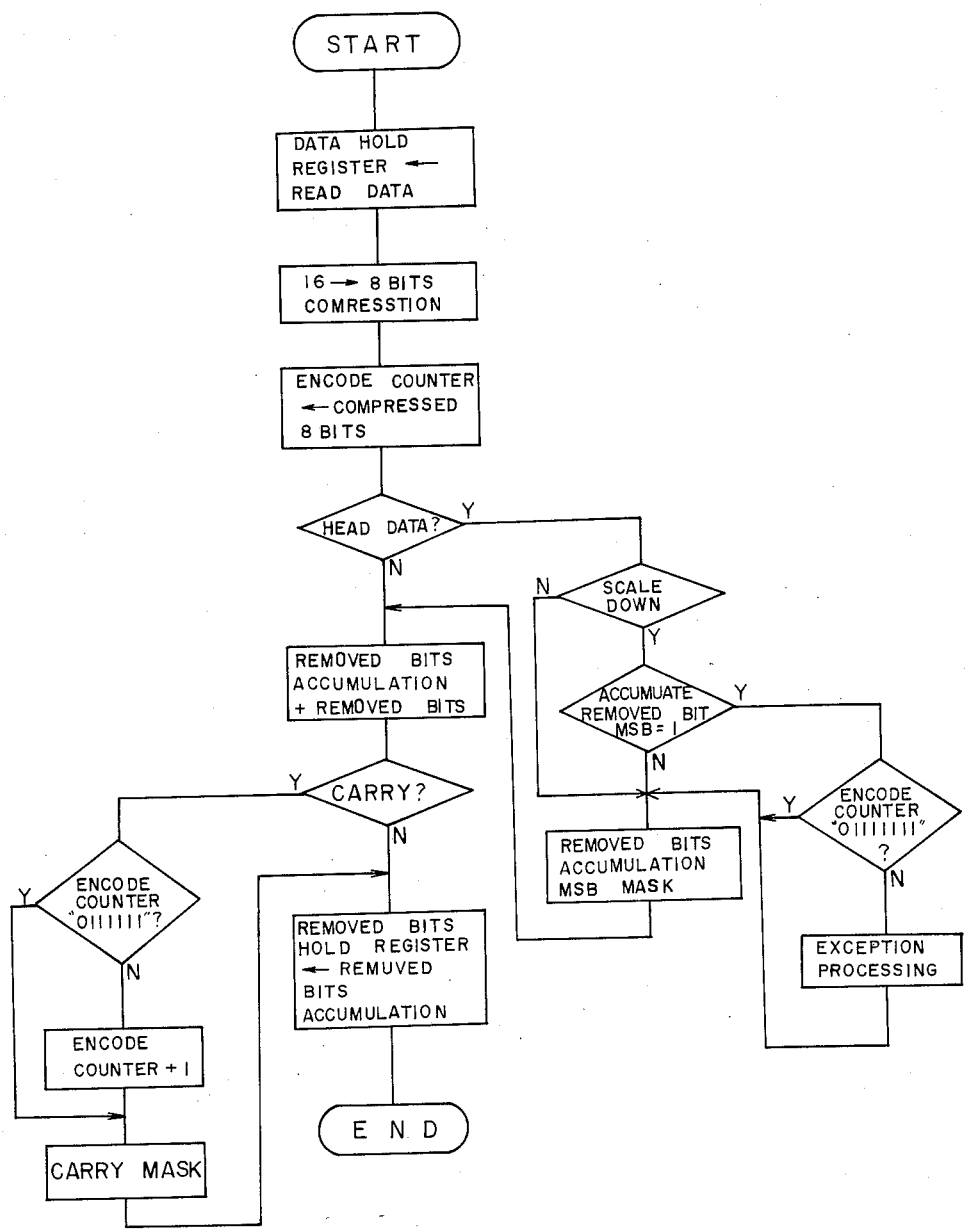
FIG. 25 is a flow chart of an embodiment of the present invention.

FIG. 25 shows a flow chart for explaining the overflow processing and the exceptional processing sequence described above.

The overflow condition of the compressed data is detected by the carry/overflow detecting logic 58. In the case where the carry results in the overflow, the carry component is disregarded by executing no carry. The reason is as follows. If, in the case where the carry of lacking bit cumulation data results in the overflow to the transmission bits, the carry is withheld and the carry component is added to the succeeding data so as to transmit the transmission data with a correct integral value, then a problem in the exactitude of data in time occurs when the withholding of the carry is done a plurality of times. In contrast, with the above measure, an effective result is obtained in practical use by executing an incomplete integral operation in the integral on the receiving side. Moreover, since the change of the scale value in the decremental direction is limited, the overflow as above stated occurs very rarely, and the foregoing processing produces satisfactory effects.

In particular, the feature of the present embodiment consists in that the function of cumulating lacking bits and the function of amending transmission data are separated, whereby an adder of original data length is not required, but an adder 55 corresponding to the maximum lacking bit length may be prepared for the lacking bit cumulation only in the data correction circuit 28b.

Figure 26:
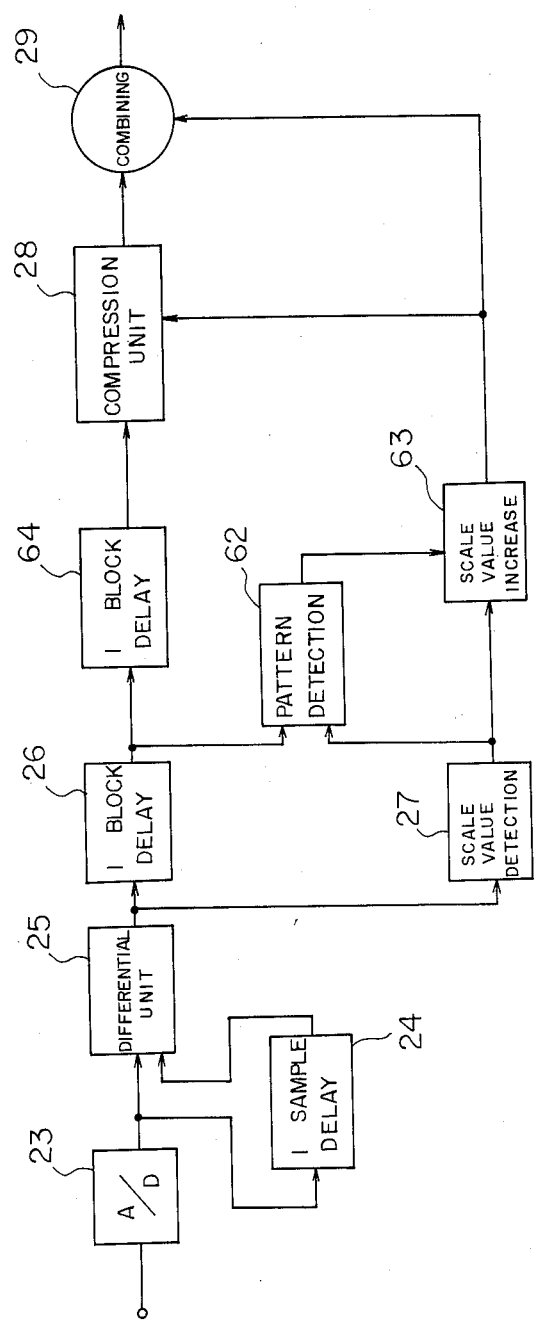
FIG. 26 is a block diagram of an embodiment of the present invention.

FIG. 26 is still another embodiment of the transmitting side of the signal transmission system of the present invention. The output of the differential unit 25, namely, a differential digital signal or DPCM signal are supplied to one block delay circuit 26 and scale value detecting circuit 27. The one block delay circuit 26 delays respective samples of DPCM signal inputted thereto by one block time. The scale value detection circuit 27 detects a scale value (encoded signal representing the amount of shifting) of DPCM signal data the absolute value of which is the maximum among the sample group and deems the scale value as the scale value of the whole block.

The data of the 1-block delay circuit 26 and the scale value data of the scale value detector circuit 27 enter a pattern detector circuit 62. The pattern detector circuit 62 checks if a pattern "01111111" exists in a valid bit pattern for transmission, which is generated when the sample data within one block inputted from the 1-block delay circuit 60 is shifted in accordance with the scale value. If the pattern exists, the output of the circuit 62 is activated, for example, rendered a high level. The scale value data of the scale value detector circuit 27 and the detection data of the pattern detector circuit 62 enter a scale value, increasing circuit 63. Therefore, this circuit 63 is so controlled that, when the output signal of the pattern detector circuit 62 is active, "1" is added to the scale value data received from the scale value detector circuit 27, whereas when the same output signal is inactive, for example, at a low level, the scale value data is left inact.

The scale value data modified by the scale value increasing circuit 63 (the original scale value, or the scale value with '1' added to the original scale value) enters the compression unit 28 and the combination circuit 29. Since the DPCM signal delayed by one block is subjected to the pattern check within one block, it is further delayed by one block by means of a 1-block delay circuit 64. The compression unit 28 compresses the further delayed DPCM signal in accordance with the scale value data amended by the scale value increasing circuit 63. In compressing the DPCM signal, lacking bits are added with an accumulator or the like, at respective sampling intervals, by using the data compression circuit 28a and the data correction circuit 28b and upon occurrence of a carry, this carry is added to the least significant bit of transmission data. The output of the compression circuit 28 thus obtained is applied to the combination circuit 29. On this occasion, since the pattern whose valid bits of DPCM are "01111111" has the scale value increased by '1', the transmission data becomes "00111111", and does not overflow. The combination circuit 29 supplies the receiving side with the compressed data of one block, and also the scale value data inputted from the scale value increasing circuit 63.

The PCM signal transmission apparatus constructed and operated as above stated, is additionally provided with the 1-block delay circuit 64 behind the 1-block delay circuit 26 for detecting the scale value from the difference signal data, and it checks with the pattern detector circuit 62 if the pattern "01111111" in the DPCM signal exists in the difference signal data within the block, while the DPCM signal is being delayed by one block by means of the 1-block delay circuit 64. When the pattern "01111111" exists in the DPCM signal data in the DPCM signal data within the block, the scale value increasing circuit 63 receives the signal for adding '1' to the scale value detected by the scale value detector circuit 27, irrespective of whether or not the carry from the cumulation of the lacking bits to the principal transmission data arises.

Accordingly, when the valid bits of the DPCM signal data have the pattern "01111111", the overflow occurring within a block and attributed to the carry of the cumulated lacking bits to the least significant bit of the DPCM signal data can be prevented from ever occurring.

It is needless to say that, in case of the maximum scale value, the increase of the scale value cannot be done. If necessary, a logic circuit corresponding to this situation may well be disposed. In order to avoid the overflow in this case, the addition between the transmission data and the content of the accumulator may of course be stopped on such occasions.

While, in the above, the case of transmitting 16-bit data with 8 bits has been described, any numbers of bits may of course be employed.

In addition, while the 1-block delay has been executed as described above, data need not be delayed for the period of time of one block because the scale value or the bit pattern "01111111" can be usually detected at high speed.

The present embodiment is applicable for the prevention of overflows within a block, not only in a case where the cumulative addition of lacking bits within the block results in a carry to transmission data, but also in a case where even when the result of the cumulative addition does not give rise to the carry, the change (decrease) of a scale value within the block borrows the position of the transmission data, whereby the top bit of the content of the cumulative addition is, in effect, carried to the transmission data.

In the foregoing, the cause of the overflow has been supposed to be either the cumulation of lacking bits within one block or the borrowing of the position of transmission data over blocks. However, both can take place at the same time.

In this case, not only "01111111", but also "01111110" must be detected. In actuality, the two patterns need not be detected, but "0111111X" may be detected. Here, X denotes either '0' or '1'. That is, only seven bits "0111111" may be examined with the least significant bit neglected.

Furthermore, since the overflow over blocks ascribable to the borrowing of the position of transmission data arises only at the first data of a block, it can be prevented by setting only the length of this data at 9 bits.

Accordingly, when the system is designed behinded in this manner beforehand, the overflows attributed to the two situations do not arise simultaneously, and the 8 bits "01111111" are detected, as explained at first.

It has been assumed in the above description that the borrow of the position of transmission data, namely, the change of the scale value numbers is, at most, one per block. In this regard, in a design which allows two borrows, 6 bits "011111" are detected. Needless to say, however, as the quantity of detection bits is decreased in this fashion, the probability at which the scale value does not decrease to a predetermined value rises to degrade the signal-to-noise ratio of the system.

As set forth above, according to the present embodiment, the pattern "011 ~" in which "1's" below "0" succeed in a required number is detected in order to prevent the occurrence of an overflow.

In order to make an embodiment of the present invention more concrete, the operation of an accumulation of lower locking bits will be explained in case where 8 bits out of DPCM signals of 16 bits are transmitted as transmission data.

Figure 27:
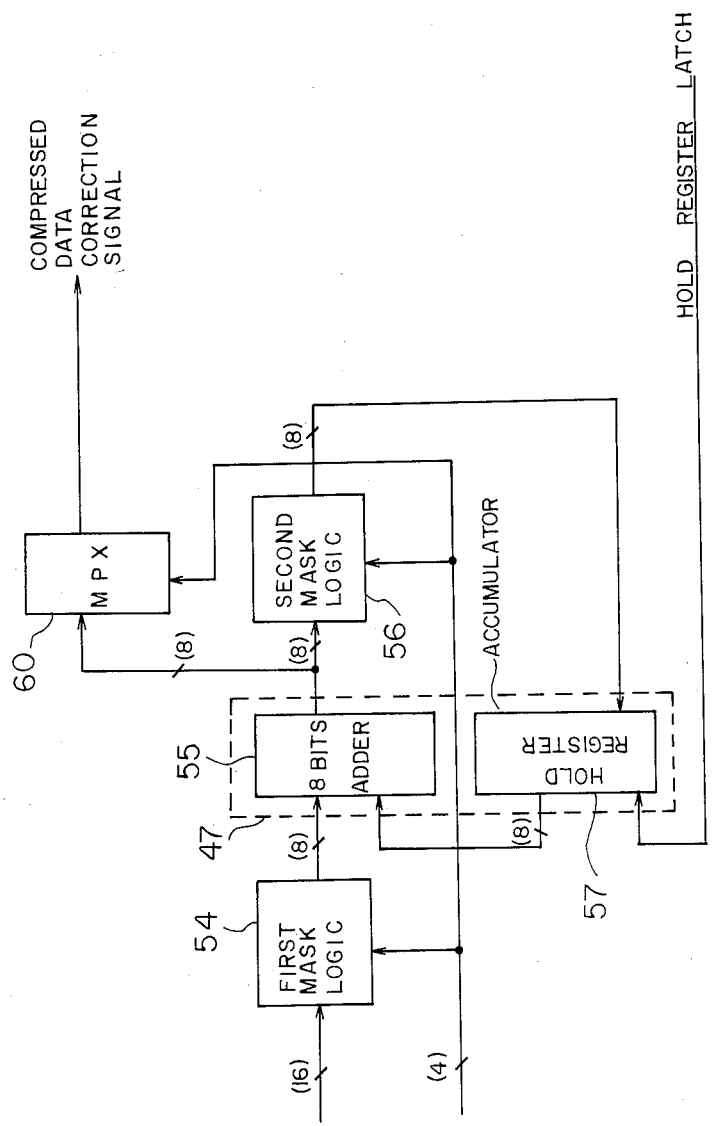
FIG. 27 is a block diagram of an embodiment of the present invention, FIG. 28 characteristic diagram in which the near instantaneous companding PCM of the present invention is compared with the prior art near instantaneous companding PCM.

FIG. 27 is a block diagram for an accumulation operation of the lower lacking bits and shows a modification of the embodiment shown in FIG. 20.

The lower 8 bits of the DPCM signal data are inputted to the first mask logic 54 and the first mask logic 54 causes some bits counted from the least significant bit and out of lower 8 bits to pass. In case where a scale value is 4 and lower 8 bits are "01101101", for example, the lower 4 bits are rounded off actually and the higher 4 bits are not rounded off and are forcedly masked to "0", thereby causing the output of the first mask logic 54 to be "00001101". The lacking bits which pass the first mask logic are inputted to the adder 55 for 8 bits, which adds the locking bits to the cumulated lacking data supplied to the adder 55 from the hold register 57.

The cumulated lacking data obtained from the addition at the 8-bit adder 55 is applied to a carry detection position selection circuit 60 comprising a multiplexer, which selects a position of a carry detection in accordance with the renewed scale value.

The second mask logic 56 masks a carry position by "0" and does not apply bit information of the carry position to the hold register 57, thereby prohibiting the data corresponding to the carry from being hood in the accumulation of the lacking data upon detecting the carry. The hold register 57 latches the lacking data accumulated up to that time by an accumulator latch signal delivered from the control sequencer 44.

Owing to the arrangement as described above, the untransmitted lacking bits in the lower 0–8 bits of the 16-bit DPCM signal data are accumulated. For example, in a case where the scale value is 8 at the maximum, the lacking bits are the lower 8 bits of the 16-bit DPCM signal data, and when the scale value is 3, the lacking bits are the lower 3 bits of the 16-bit DPCM signal data. At the scale value of 3, the adding operation is properly executed with the 8-bit adder 55 or the like in such a way that the higher bits than the third bit counted from the LSB of the input of the first mask logic 54 supplied with the lower 8 bits are masked into '0', thereby leaving three lower bits counted from the LSB without suffering from any mask.

Thus, owing to the first mask logic circuit 54, only the true lacking bits become the object of the addition. When the fourth bit, as reckoned from the least significant bit, has changed from '0' to '1' through the addition, this '1' is added as a carry input to the 8-bit transmission data of the DPCM signal data, whereby the correction is made. The '1' of the fourth bit is thus transmitted equivalently, and it must be erased from the hold register 57. The erasure is executed by the second mask circuit 56.

According to the present embodiment as described above in detail, whenever the valid upper bits of DPCM have the pattern "01111111", the scale value changes, so that even if the cumulation of the lacking bits induces a carry, the transmission data can be perfectly prevented from overflowing.

Furthermore, the present embodiment can be constructed merely by detecting only the pattern "01111111" of the transmission data, and need not consider the carry from the cumulation of the lacking bits, so that it can be practiced with a very simple circuit arrangement.

The reason why the accumulation operation of the removed bits or lacking bits in the present invention relating to both DPCM and NIPCM decreases quantizing noise is as follows.

The conventional NIPCM produces quantizing noise caused by bits which can not be reproduced due to compression. The auditory organic functions of the human is more sensitive to quantizing noise in the low frequency range and NIPCM compresses data to a greater extent as to higher frequencies and the quantizing noise of the higher frequency signals becomes larger.

The foregoing explanation has been made by assuming that "0" is placed in the bit position for the removed bits in the receiving side.

Thus, the removed bits are accumulated in the transmitting side as they are.

However, if the average of the removed bits, namely, "01111 . . . " or "10000 . . . " is placed in the bit position of the removed bits in the receiving side, the removed bits cannot be accumulated as they are. Because the error in data between the transmitting side and receiving side is different depending on the bit value to be placed in the bit position of the removed bit in the receiving side.

Thus, if the average value is placed in the receiving side as described above, the value to be accumulated in the transmitting side should be the difference obtained by subtracting the predetermined average value such as "0111 . . . " from the removed bits.

Thus, according to the present invention, the difference between the original data and the compressed data, which is in car used by every one bit is accumulated and, when the accumulated value reaches a value corresponding to the least significant bit of the transmission data, the transmission data is corrected.

Accordingly, as described above; the error may be produced only in a positive direction, thereby accumulating in the positive direction, namely, adding, the error. The transmission data may be corrected by a carry produced as the result of accumulation of the error in the positive direction. In contrast, the error may be produced in a negative direction thereby accumulating in the negative direction, namely, subtracting, the error, the transmission data may be corrected by a borrow produced as the result of the accumulation of the error in the negative direction.

Further, if the average value of the removed bits is used as the reference, both a carry and borrow may be used to produce a corrected transmission data.

According to the present invention, the removed bits causing quantizing noise are not truncated, the removed bits are cumulated by the accumulator, a carry is reflected in the compressed transmission data, thereby resulting in decreasing quantizing noise as an effective value. The fact that the removed bits are added at a plurality of times and a carry is added to the transmission data in the transmitting side is equivalent to increasing the number of bits of companding data at low sampling frequencies, thereby decreasing noise in low frequency range. As recided above, the accumulator cumulates the removed bits. Thus, if the value of the removed bits is larger than half the value of LSB, a carry is produced and transmitted during two samplings and if the removed bits are smaller than half the value of LSB, a carry is not produced during two samplings. If the removed bits are larger than a quarter the value of LSB, a carry is produced during four samplings. The fact that the frequency of the occurrence of the carry is at every two samples is equal to transmitting LSB at half the sampling frequencies and, in other words, to transmitting data at the bit accuracy which is one bit higher. A carry produced at every four samples corresponds to a quarter the sampling frequencies, thereby enabling to transmit data at an accuracy which is two bits higher. As is considered likewise, if a sampling frequency is fs, signals having frequencies of less than $fs/2^n$ are transmitted at such accuracy as is $n-1$ bits higher than the number of bits to be transmitted. This means that the sampling frequency is divided into plural frequencies due to the accujulation of the removed bits. Namely, if 10 bits are transmitted at fs=32 KHz under NIPCM and the operation of the accumulation of the present invention is applied to such transmission, it is equivalent to transmission of such accuracy as to transmit 11 bits at a sampling frequency=fs/2=16 KHz and 12 bits at a sampling frequency=fs/4=8 KHz and transmit 14 bits at a sampling frequency=fs/16=2 KHz, which may achieve the same accuracy as the original data of 14 bits. The signal to be transmitted increases its accuracy within such range as to satisfy the sampling theorem. Accordingly according to "the accumulation of the removed bits", the total sum of the transmission data is substantially equal to that of the original data. This means that the D.C. component is correctly transmitted and that there is problem if it is combined with DPCM, namely, if an integration is performed in the receiving side. The amount of the removed bits is shown by a frequency of an occurency of a carry. As far as an interval of the occurence of the carry fully satisfies the sampling theorem, the noise can be satisfactorily decreased with regard to a low frequency range.

According to conventional NIPCM, spectrum characteristics of a transmission system concerning an input signal of a low frequency represents uniform spectrum due to a lack of an accumulator. According to the NIPCM provided with an accumulator of the present invention, energy spectrum of noise component in the low frequency range is subjected to degeneration in the spectrum characteristics and the energy is concentrated conspicuously in a high frequency range. Thus, if the receiving side of NIPCM is provided with a de-empasis circuit for decreasing a signal and noise of a high frequency, an S/N ratio is improved and, especially, the effect of the improvenent in an S/N ratio in the low frequency range becomes remarkable. This means that the compensation achieved by the employment of the accumulator makes it posible to transmit data at the accuracy which is higher than that of the compressed data length. As a pre-emphsis emphasizing a signal of a higher frequency in advance has differential characteristics in which a portion of an abrupt change is emphasized and a de-emphasis has integral characteristics in which a portion of an abrupt change is suppressed, this can be stated along an actual transmission in such a manner that that the encoder is provided with a differentiator and the decoder is provided with an integrator. This construction is no other than the basic DPCM system. Thus, the present invention can effectively combine DPCM and NIPCM, thereby providing DPCM (Differential Scale Companding PCM).

Figure 28:
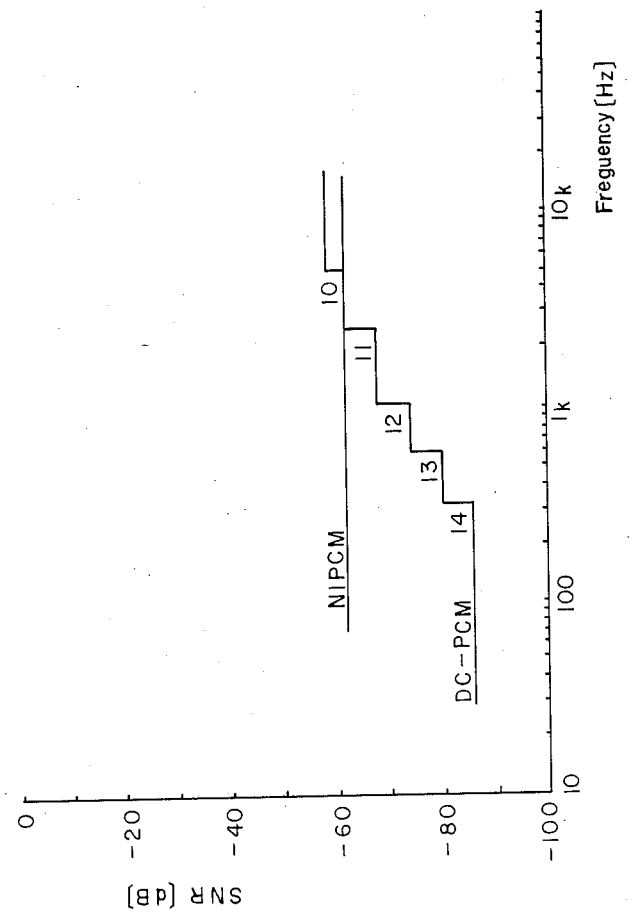

FIG. 28 shows a comparison between DCPCM of the present invention and the conventional NIPCM in respect of a frequency versus S/N ratio, where the transmission channel is 10 bits, sampling frequency is 32 KHz, and input level is 0 dB. In the DPCM, the S/N ratio is improved in a step-like characteristic towards a lower frequency range. Namely, in over a frequency of 3 KHz, both DPCM and NIPCM transmit 10 bits and the S/N ratio is similar. When the frequency becomes lower, the transmission bits increase 10, 11, 12, 14 in DPCM, thereby increasing the S/N ratio, while the transmission bits are fixed to 10 bits in NIPCM, thereby not improving the S/N ratio. Thus, it is clear that the S/N ratio is decreased by the effect of the accumulation of the removed bits in the transmitting side.

Thus, the DCPCM can be summarized as follows.

1. A complete integration in the receiving side can avoid as accumulation of errors and thus, the transmission error of the D.C. signal can be substantially deliminated.

2. Owing to the accumulation in the transmitting side, the quantizing noise in the low frequency range can be decreased conspiciously, and both the signal and the quantizing noise are lowered in the high frequency range.

3. Even if, in a simultaneous transmission of a high frequency signal and a low frequency signal, a scale value is increased by raising the level of the high frequency signal, thereby to extend the range of the removed bits, and the level of the low frequency signal is lowered, thereby causing the differential value thereof to fall in the range of the removed bits, the low frequency signal can be transmitted without distortion by only generating a carry.

Accordingly, the means for employing "accumulation of removed bits" achieves a remarkably effective operation, thereby enabling data companding transmission through DCPCM, with the result that the data transmission of 8 bits in DCPCM is equal to or even more than that of 10 bits in NIPCM in respect of the total characteristics of the data transmission of the present invention.

As described above in detail, according to the present invention, there is provided a digital data transmission system in which, in NIPCM, the transmitting side is provided with an accumulator for cumulating removed bits, thereby compressing data in a direction of time and making the transmission data to have the same accuracy as the original data in the total sum of data transmitted in a time direction and further a scale information is made corresponding to a transmission data block, thereby combining the transmission data with the scale information to transmit them in a bit parallel or bit serial time divisional manner, resulting in achieving a high quality data transmission system by using the smaller number of transmission bits.

According to the present invention, there is provided a digital data transmission system in which, in NIPCM and DPCM, the transmitting side is provided with an accumulator to cumulate removed bits and the receiving side accumulate transmitted DPCM data in an integrator to convert it to PCM data, thereby making the total sum of the transmission data in a dimension of time to be equal to that of the receiving data in a dimension of time, with the result that there is substantially no truncated bits in spite of considering removed bits, thereby enabling a high quality transmission of data.

Further, according to the present invention, there is provided various means for preventing a deterioration of transmission data due to an overflow of the transmission data, thereby increasing a quality of transmission data further more.

In PCM or DPCM provided with an accumulator for cumulating removed bits in the transmitting side, quantizing noise becomes non-correlated noise and a high frequency component in the low frequency range is subject to degeneration, thereby causing the noise component to concentrate in the high frequency range. Namely, if the removed bits are cumulated N times to produce a carry, it is equivalent to changing a sampling frequency to 1/N of the sampling frequency, thereby reducing a noise in a low frequency range but the lowered sampling frequency can not follow a noise in a high frequency range, thereby causing the noise to concentrate in the high frequency range. As the auditory organ of the human is sensitive to correlated noise of an input signal of a low frequency it is greatly advantageous from a psychoacoustic view point that the quantizing noise is reduced to a low frequency range, thereby providing a remarkable noise reduction effect. According to the NIPCM provided with an accumulator of the present invention, energy spectrum in the low frequency range is subjected to degeneration in the spectrum characteristics and the energy is concentrated conspicuously in a high frequency range. Thus, if the receiving side of NIPCM is provided with a de-emphasis circuit for decreasing a signal and noise of a high frequency, an S/N ratio is improved. When an NIPCM system is provided with the integrator in the receiving side, the noise can be reduced by adding a de-emphasis circuit to the receiving side. When the DPCM is combined with a near-instantaneous companding system, the transmitting side perfoms a pre-emphasis operation with differential characteristics of emphasizing a high frequency region and cumulates the removed bits by an accumulator, thereby causing noise to concentrate in a high frequency range and reducing a low frequency noise and the receiving side performs de-emphasis operation with integral characteristics of de-emphasizing a high frequency region by using an integrator for converting DPCM data to PCM data. Thus, in such DPCM system as to provide the transmitting side with the accumulator, noise and signals in a high frequency range can be reduced without any de-emphasis circuit in the receiving side. As a result, an S/N ratio is improved in a low frequency range and an influence of a higher frequency noise on an auditory organ of the human can be suppressed. In the near-instantaneous companding system, the provision of an accumulator in the transmitting side is effectively combined with DPCM system, thereby achieving a high quality transmission of data. As a further effect of the provision of the accumulation in the transmitting, a shift and fluctuation of DC level caused by removed bits is eliminated and, when a muliplex signal comprising a plurality of sinusoidal waves having different frequencies is transmitted, the low frequency component can be transmitted effectively, thereby enabling a multiplex signal.

As described above in detail, according to the present invention, in a digital transmission apparatus wherein the average level of transmission data obtained through PCM or especially DPCM is lowered, a digital transmission system and apparatus can be provided wherein, when significant upper bits are to be sent, lower lacking bits are stored in the accumulator of an accumulator, they are cumulatively added with the lacking bits of the next sending data by the accumulator and upon the carry of the resulting sum, '1' is added to the least significant bit of the sending data for correction; and also, a scale information is once sent in a block unit, whereby the data is transmitted with a substantially small number of bits, and quantization noise or a cumulative error is rendered slight. Furthermore when an overflow detecting and processing circuit is additionally provided, the effects achieved are that the occurrence of the overflow error of the transmission data is satisfactorily suppressed to more enhance the transmission accuracy in practical use, and that a digital signal transmission apparatus whose hardware does not become complicated can be constructed.

According to the present invention, therefore, the correction of the transmission data, the carry based on the cumulation of the lacking bits and the checks attendant upon them, can be very effectively performed with the very simple arrangement. Needless to say, the present invention is not restricted to the transmission of DPCM codes but is also applicable to other PCM transmissions, including the usual PCM.

What is claimed is:

1. A data transmission system having a transmitting side comprising: transmission data and scale information forming means for obtaining transmission data having a shorter data length than original data composed of PCM data or DPCM data based on the more significant bits of the original data, and for obtaining a scale word representing bit positions of the more significant bits in the original data upon which the transmission data is based; and data compression means comprising an accumulation means for accumulating removed bits, the removed bits being obtained by rounding off less significant bits of the original data when the transmission data is formed, and a carry means for adding a carry resulting from the accumulation of the removed bits to the least significant bit of said transmission data.

2. A data transmission system according to claim 1, wherein said transmission data and scale information forming means includes means for determining a magnitude of said original data and for determining one scale word from one block comprising plural samples when the transmission data is obtained from the original data, thereby forming a near-instantaneous companding data.

3. A data transmission system according to claim 1, wherein said transmitting means includes a means for combining said transmission data and scale word for transmission in a time divisional manner.

4. A data transmission system according to claim 1, wherein said transmitting means includes means for forming DPCM data by subtracting present PCM data from PCM data preceding the present data by one sample.

5. A data transmission system according to claim 1 further including a receiving side comprising an integration means for converting said transmission data to PCM data.

6. A data transmission system according to claim 5 wherein said receiving side comprises; a synchronizing detection means for obtaining a block synchronizing signal from the transmission data, a separation means for separating the transmission data from the scale word in accordance with the block synchronizing signal, and data extending means for obtaining the original data from the transmission data.

7. A data transmission system according to claim 1, comprising a receiving means for receiving transmission data and a scale word formed in the transmitting side, in which less significant bits of original data are removed from the original data and accumulated to generate a carry, and the carry is added to the least significant bit of the transmission data.

8. The data transmission system according to claim 1, wherein, upon determining that the value of the scale word has decreased from the previously determined value of the scale word, a next value of the scale word is determined by suppressing a change in the value of the scale word with regard to the previously determined value, and, where the value of the scale word increases, the increased scale word value is used.

9. The data transmission system according to claim 1 wherein only first data of a following data block is increased by a number of bits, whereby transmission data blocks with such an increased number of bits are transmitted.

10. The data transmission system according to claim 1, including means for determining if an overflow of the transmission data would occur upon the next addition of the original data with the carry from previously accumulated removed bits, and means for performing said addition if it is determined that the overflow would not occur, and for not performing said addition and for performing a predetermined logic operation as to prevent the overflow if it is determined that the overflow would occur on said addition.

11. The data transmission system according to claim 10, wherein said predetermined logic operation as to prevent the overflow is to replace the less significant removed bits of the accumulated data by a predetermined value.

12. The data transmission system according to claim 11, wherein said predetermined value is the maximum value of the removed bits.

13. The data transmission system according to claim 10, wherein said predetermined logic operation as to prevent the overflow is to delete a carry resulting from the accumulation of the removed bits.

14. The data transmission system according to claim 10, wherein said predetermined logic operation as to prevent the overflow is to clear previously accumulated removed bits and to use less significant bits of new original data as removed bits to be accumulated.

15. A data transmission system comprising: means for accumulating removed bits when PCM or DPCM encoded data are subject to a near-instantaneous companding system, means for adding a carry of the accumulated removed data to transmission data to thereby transmit said carry, a detection circuit for detecting whether the transmission data, obtained by shifting the encoded data in accordance with a scale value, has a bit status comprising a most significant bit of the value "0" and all other bits of the value "1", and means for changing said scale value when said bit status of the transmission data is detected.

16. The data transmission system according to claim 15, wherein, whenever the transmission data has said bit status, a value formed by adding "1" to the present scale value is used as a new scale value.

17. A data transmission system having a transmitting side comprising a transmission data and scale information forming means for obtaining transmission data having a shorter data length than original data composed of PCM data of DPCM data based on the more significant bits of the original data, and for obtaining a scale word representing digit positions of the more significant bits in the original data upon which the transmission data is based, means for accumulating a difference between the transmission data and original data, and means for transmitting data obtained by arithmetically combining said transmission data and at least one bit of overlapping data of the accumulated data obtained by said accumulating means, said overlapping data being data positioned at such digit positions of the more significant bits of said accumulated data which overlap the digit positions of the less significant bits of said transmission data.

18. The data transmission system according to claim 17, wherein said means for transmitting data obtained by arithmetically combining includes means for adding said transmission data and the accumulated data.

19. The data transmission system according to claim 17, wherein said means for transmitting data obtained by arithmetically combining includes means for subtracting said transmission data and the accumulated data.

* * * * *